United States Patent
Park et al.

(10) Patent No.: US 9,269,429 B2
(45) Date of Patent: Feb. 23, 2016

(54) RESISTIVE MEMORY DEVICE, RESISTIVE MEMORY SYSTEM, AND METHOD OF OPERATING RESISTIVE MEMORY DEVICE

(71) Applicant: SAMSUNG ELECTRONICS CO., LTD., Suwon-si, Gyeonggi-do (KR)

(72) Inventors: Hyun-Kook Park, Anyang-si (KR); Dae-Seok Byeon, Seongnam-si (KR); Yeong-Taek Lee, Seoul (KR); Bo-Geun Kim, Hwaseong-si (KR); Yong-Kyu Lee, Hwaseong-si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/665,127

(22) Filed: Mar. 23, 2015

(65) Prior Publication Data
US 2016/0019951 A1  Jan. 21, 2016

(30) Foreign Application Priority Data
Jul. 18, 2014 (KR) .................. 10-2014-0091306

(51) Int. Cl.
*G11C 11/00* (2006.01)
*G11C 13/00* (2006.01)

(52) U.S. Cl.
CPC .......... *G11C 13/003* (2013.01); *G11C 13/0069* (2013.01)

(58) Field of Classification Search
CPC .................................................. G11C 11/00
USPC ............. 365/46, 94, 100, 113, 129, 148, 163; 257/2–5, 296, E31.047, E27.006; 438/29, 95, 96, 166, 259, 365, 482, 438/486, 597; 977/754
See application file for complete search history.

(56) References Cited

U.S. PATENT DOCUMENTS

| | | | |
|---|---|---|---|
| 6,754,102 B2 | 6/2004 | Kleveland et al. | |
| 8,338,224 B2 | 12/2012 | Yoon et al. | |
| 8,351,236 B2 | 1/2013 | Yan et al. | |
| 8,427,863 B2 | 4/2013 | Ranjan et al. | |
| 8,519,376 B2 | 8/2013 | Dimitrov et al. | |
| 8,686,428 B1 | 4/2014 | Sekar et al. | |
| 2007/0285965 A1* | 12/2007 | Toda | G11C 5/02 365/148 |
| 2008/0002456 A1* | 1/2008 | Toda | G11C 11/5678 365/148 |
| 2008/0002457 A1* | 1/2008 | Toda | G11C 11/5678 365/148 |
| 2008/0198645 A1* | 8/2008 | Kang | G11C 5/025 365/148 |
| 2008/0198646 A1* | 8/2008 | Park | G11C 13/0007 365/148 |
| 2010/0202186 A1* | 8/2010 | Sato | G11C 29/832 365/148 |
| 2012/0061637 A1 | 3/2012 | Cai et al. | |
| 2013/0168634 A1 | 7/2013 | Lee | |
| 2013/0265814 A1 | 10/2013 | Shin | |
| 2013/0313502 A1 | 11/2013 | Park | |

FOREIGN PATENT DOCUMENTS

| | | |
|---|---|---|
| KR | 10-0527550 | 11/2005 |
| KR | 10-20130142411 A | 12/2013 |

* cited by examiner

*Primary Examiner* — Harry W Byrne
(74) *Attorney, Agent, or Firm* — Volentine & Whitt, PLLC

(57) ABSTRACT

A resistive memory device includes a memory cell array including a plurality vertically stacked layers having one layer designated as an interference-free layer and another layer designated as an access prohibited layer, wherein the interference-free layer and the access prohibited layer share a connection with at least one signal line and access operations directed to memory cells the access prohibited layer are prohibited.

20 Claims, 24 Drawing Sheets

RESISTIVE MEMORY DEVICE, RESISTIVE MEMORY SYSTEM, AND METHOD OF OPERATING RESISTIVE MEMORY DEVICE

CROSS-REFERENCE TO RELATED APPLICATIONS

This application claims the benefit of Korean Patent Application No. 10-2014-0091306 filed on Jul. 18, 2014, the subject matter of which is hereby incorporated in its entirety by reference.

BACKGROUND

The inventive concept relates generally to resistive memory devices and methods of operating memory systems including at least one resistive memory device. More particularly, the inventive concept relates to resistive memory devices including a plurality of layers as well as methods of operating memory system including at least one resistive memory device including a plurality of layers.

Ongoing research and development efforts seek to provide next generation memory devices having nonvolatile data storage characteristics, high memory cell integration density, high operating speeds, and low power consumption. That is, next generation memory devices should provide the memory cell integration density of dynamic random access memory (DRAM) devices, the nonvolatile data storage capabilities of flash memory devices, and the high operating speed of static random access memory (SRAM) devices. Phase change random access memory (PRAM or PcRAM) devices, nano floating gate memory (NFGM) devices, polymer random access memory (PoRAM) devices, magnetic random access memory (MRAM) devices, ferroelectric random access memory (FRAM or FeRAM) devices and resistive random access memory (RRAM or ReRAM) devices are attracting much attention as the next generation memory devices potentially meeting the foregoing design requirements.

SUMMARY

Embodiments of the inventive concept provide operating methods and resistive memory devices including a plurality of layers, wherein at least one of the layers is configured as an access prohibition layer and at least another one of the layers is an interference-free layer proximate the prohibition layer, such that potential electrical interference conventionally arising from memory cell access in a layer proximate the interference-free layer is markedly reduced.

According to an aspect of the inventive concept, there is provided a resistive memory device including; memory cell array comprising a plurality vertically stacked layers including one layer designated as an interference-free layer and another layer designated as an access prohibited layer, wherein the interference-free layer and the access prohibited layer share a connection with at least one signal line, and access operations directed to memory cells disposed in the access prohibited layer are prohibited.

According to another aspect of the inventive concept, there is provided a resistive memory device comprising; a memory cell array comprising a plurality vertically stacked layers including a layer designated as an interference-free layer, another layer designated as a first access prohibited layer, and still another layer designated as a second access prohibited layer, wherein the interference-free layer respectively shares with each one of the first and second access prohibited layers a connection with at least one signal line, and access operations directed to memory cells disposed in the first and second access prohibited layers are prohibited.

According to another aspect of the inventive concept, there is provided a resistive memory system comprising; a memory controller receiving a write request from a host, and providing a write command, a write address and write data to a resistive memory device in response to the write request, and the resistive memory device comprising control logic and a memory cell array comprising a plurality vertically stacked layers including one layer designated as an interference-free layer and another layer designated as an access prohibited layer, wherein the interference-free layer and the access prohibited layer share a connection with at least one signal line and access operations directed to memory cells disposed in the access prohibited layer are prohibited.

BRIEF DESCRIPTION OF THE DRAWINGS

Certain embodiments of the inventive concept will be more clearly understood upon consideration of the following detailed description taken in conjunction with the accompanying drawings in which.

DETAILED DESCRIPTION

Figure 1:
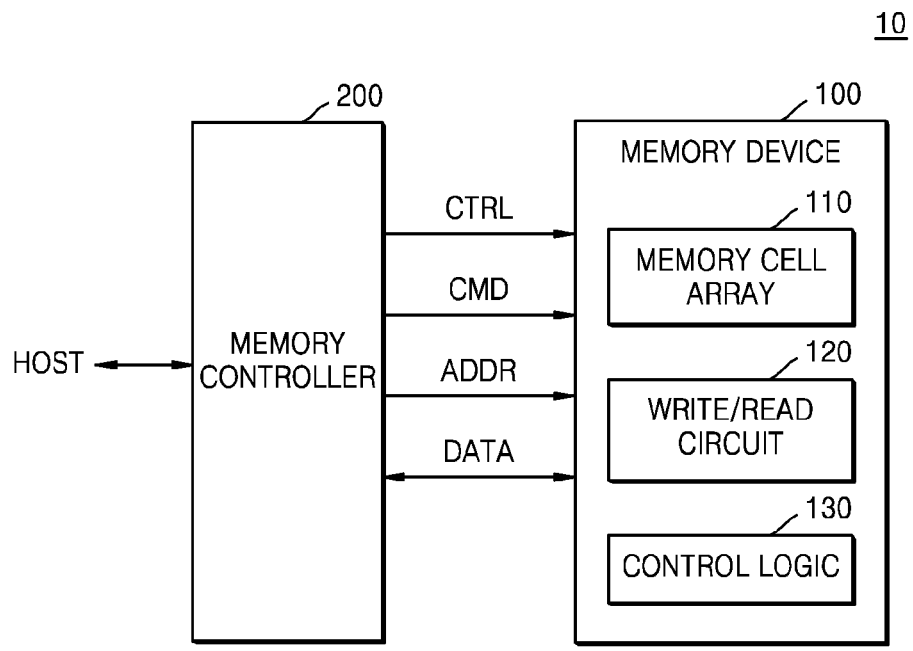
FIG. 1 is a block diagram of a memory system including a resistive memory device according to an embodiment of the inventive concept.

Certain embodiments of the inventive concept will now be described in some additional detail with reference to the accompanying drawings. The inventive concept may, however, be embodied in many different forms, and should not be construed as being limited to only the illustrated embodiments. That is, the scope of the inventive concept includes many revisions, equivalents, and/or substitutions to the specific examples described herein. Throughout the written description and drawings like reference numbers denote like or similar elements. In the drawings, the dimension(s) and/or relative dimensions of certain structures may be exaggerated for clarity.

All examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 including a resistive memory device 100 and a memory controller 200 according to an embodiment of the inventive concept.

The resistive memory device 100 includes a memory cell array 110, a write/read circuit 120 and control logic 130. Since the resistive memory cell array 110 is assumed to operatively arrange a plurality of resistive memory cells, hence the memory system 10 may be referred to as a resistive memory system.

In response to a write request received from a host, the memory controller 200 will control the execution of a corresponding write operation by the memory device 100 that writes (or programs) designated "write data" to the resistive memory device 100. That is, the memory controller 200 in response to a write request will provide a write address ADDR, a write command CMD, one or more control signal(s) CTRL and corresponding write data DATA to the memory device 100 during a write operation. Alternately, in response to a read request received from the host, the memory controller 200 will control the execution of a corresponding read operation by the memory device 100 that retrieves designated "read data" from the resistive memory device 100. That is, the memory controller 200 in response to a read request will provide a read address ADDR, a read command CMD, and one or more control signal(s) CTRL to the memory device 100 during a read operation.

Of course, the resistive memory system 10 is able to execute may other operations in addition to write and read operation (e.g., an erase operation) where such operations may be externally initiated by some request or control signal provided by the host, or internally initiated by action of the memory controller 200 and/or resistive memory device 100.

In certain embodiments of the inventive concept, the memory controller 200 may include a Random Access Memory (RAM), a processing unit, a host interface, and a memory interface. The RAM may be used as a working memory by the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, ATA (Advanced Technology Attachment), Serial-ATA, Parallel-ATA, SCSI, ESDI, and Integrated Drive Electronics (IDE).

According to certain embodiments of the inventive concept, the memory cell array 110 will include a number of "vertically stacked" layers arranged wholly or partially one on top of the other. In this context, those skilled in the art will understand that the spatially relative terms used hereafter, such as "vertical", "top", "bottom", "stacked on", etc., descriptively arbitrary in nature. As will be described in some additional detail hereafter, the principle physical dimensions of one or more material "layers" (e.g., a substrate, an interposer, a printed circuit board, a deposition, etc.) may be used to arbitrarily define a horizontal (or X-Y) plane. With this arbitrary planar definition (that may vary with rotation of the defining layer), one or more additional layers may be stacked thereon or stacked thereunder to provide a vertical stack of layers.

In this regard, certain layers of the vertically stacked plurality of layers may be used to arrange resistive memory cells (hereafter, "memory cells" for the sake of brevity). The memory cells may be respectively arranged in regions of a layer where first signal lines and second signal lines cross each other. Here, the first signal lines may be bit lines and the second signal lines may be word lines, or vice verses.

Each of the memory cells may be configured for use as single-level memory cells (SLC) that stores one bit of data per memory cells, and/or as multi-level memory cells (MLC) that store two or more bits of data per memory cell. Thus, single bit SLC read, write and store data according to two (2) resistance level distributions, while 'N-bit' MLC read, write and store data according to $2^N$ resistance level distributions.

Each of the memory cells will include a variable resistor element (not shown in FIG. 1) capable of being programmed to exhibit a particular resistance in a range of variable resistances. For example, the variable resistor element may be formed from one or more phase change material(s) (e.g., Ge—Sb—Te) capable of being programmed according to applied thermal energy, and may be referred to as Phase-change RAM (PRAM). Alternately, the variable resistor element may be formed from one or more complex metal oxide(s) arranged as an upper electrode, a lower electrode, and/or a transition metal oxide disposed there between, and may be referred to as a Resistive RAM (RRAM). Alternately, the variable resistor element may be formed of an upper electrode of a magnetic material, a lower electrode of the magnetic material with a dielectric there between, and may be referred to as a Magnetic RAM (MRAM).

The write/read circuit 120 may be used to perform write and read operations on the memory cells designated within (or "selected") the memory cells array 110. The write/read circuit 120 may be connected (or coupled) to the memory cells via the bit lines, and may include a write driver capable of writing data to the memory cells, and a sense amplifier capable of amplifying one or more voltages or current used to discriminate data stored by the memory cells.

The control logic 130 may be used to generally control the execution of operations by the memory device 100, and may control the write/read circuit 120 to perform a memory operation, such as a read/write operations. That is, execution of read/write operations with respect to the memory device 100 may be accomplished by selectively applying control voltage(s) (or current(s)) defined by the control logic 130 to the write/read circuit 120. Thus, one or more voltage (or current) generators (not shown in FIG. 1) may be used to generate (e.g.,) write voltage(s) (or write current(s)) and/or read voltage(s) (or read current(s)) provided to a selected memory cell, as well as certain bias voltages for biasing non-selected memory cells. Such voltage/current generators may be further included in the memory device 100 or may be externally provided.

During a write operation direct to a selected memory cell of the memory device 100, the resistance state of a variable resistor element of the selected memory cell may be increased or decreased in accordance with the value of the write data being written. Thus, each write operation may be classified as a "reset write operation" or a "set write operation", where a set state is assumed to be a relatively low resistor value, and a reset state is assumed to be a relatively high resistor value. Hence, the reset write operation is used to increase the resistance state of the variable resistor element, and the set write operation is used to decrease same.

When performing at least a write operation or a read operation on a selected memory cell of the memory cell array 110, the selected memory cell (i.e., the memory cell(s) being "accessed") and all non-selected memory cells (i.e., the memory cells not being accessed) should ideally be electrically separated from each other. To operatively provide this condition, appropriate signal line biasing operations are performed with respect to the first and second signal lines. For example, one or more selection voltage(s) may be applied to the first and second signal lines connected to the selected memory cell(s) (i.e., "selected signal lines") while one or more non-selection (or "inhibit") voltage(s) are applied to the first and second signal lines connected to memory cells other than the selected memory cells (non-selected signal lines).

The memory cell array 110 having a vertically stacked structure may alternately be referred to as three-dimensional (3D) structure, where at least one of the layers included in the memory cell array 110 include memory cell regions arranging resistive memory cells. Some other layers among the plurality of layers may be used as control layers arranging peripheral circuits used to access memory cells during memory operations. One or more control layer(s) included in the memory cell array 110 may include the write/read circuit 120 and/or control logic 130 shown in FIG. 1.

In the foregoing description, the electrical isolation desired during memory cell access operations (e.g., a read/write operation) between selected memory cell(s) and non-selected memory cells is often less than ideal. That is, even when appropriate bias voltage(s) are applied to non-selected memory cells, a voltage difference along the length of a signal line connecting non-selected memory cells that are adjacent to (i.e., physically and/or electrically proximate) selected memory cell(s) may induce an undesired leakage current. And as a result of this leakage current, one or more of the non-selected memory cells may have its resistance state changed (increased or decreased) in an undesired manner. This phenomenon will generally be referred to hereafter as "interfering" or "interference" with the non-selected memory cell(s). And under certain conditions. such interference may impair the data reliability of the memory system 10.

Recognizing the failure of conventional resistive memory systems to fully isolate memory cells selected during an access operation from non-selected memory cells arranged in the same memory cell array, certain embodiments of the inventive concept provide a memory cell array wherein a stacked plurality of layers includes at least one "interference-free" layer providing memory cells that are much better isolated from potential interference conditions. Such memory cells are arranged and accessed in an interference-free layer may be termed "interference-free memory cells", where such interference-free memory cells may be used to store critical data (e.g., metadata) in the memory system 10.

For example, certain resistive memory devices according to the embodiments of the inventive concept are assumed to include at least one interference-free layer that is "disconnected" from the one or more surrounding standard layers. Here, the term "standard layer" is used to denote any layer that is not specifically designated as an interference-free layer, and the terms "disconnect" or "disconnected" refers to any physical and/or electrical configuration of signal lines extending between an interference-free layer and one or more adjacent or proximate standard layer, such that the transmission of potentially interfering electrical signals via the signal lines otherwise commonly extending between the interference-free layer and an adjacent or proximate standard layer is greatly reduced. In this manner, data reliability for the memory cell of the interference-free layer may be improved.

Those skilled in the art will appreciate that a variety of data may be stored in the memory device 100, including user data (i.e., data stored in response to one or more user actions), boot code, system operating code, metadata, application software, ECC data such as parity data, system control data, reference information, etc. Some of these data types (e.g., metadata or reference information) are far more critical to proper operation of the resistive memory system than the other data types. According to certain embodiments of the inventive concept, one or more interference-free layers may be used in the memory cell array 110 to store particularly critical data types or data otherwise designated as being critical in order to ensure the integrity of such data.

The memory controller 200 and memory device 100 may be integrated in a common semiconductor device, such as a memory card. For example, the memory controller 200 and memory device 100 may be integrated and configured to operate as a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). Alternately, the memory controller 200 and memory device 100 may be integrated and configured to operate as a Solid State Disk/Drive (SSD).

Figure 2:
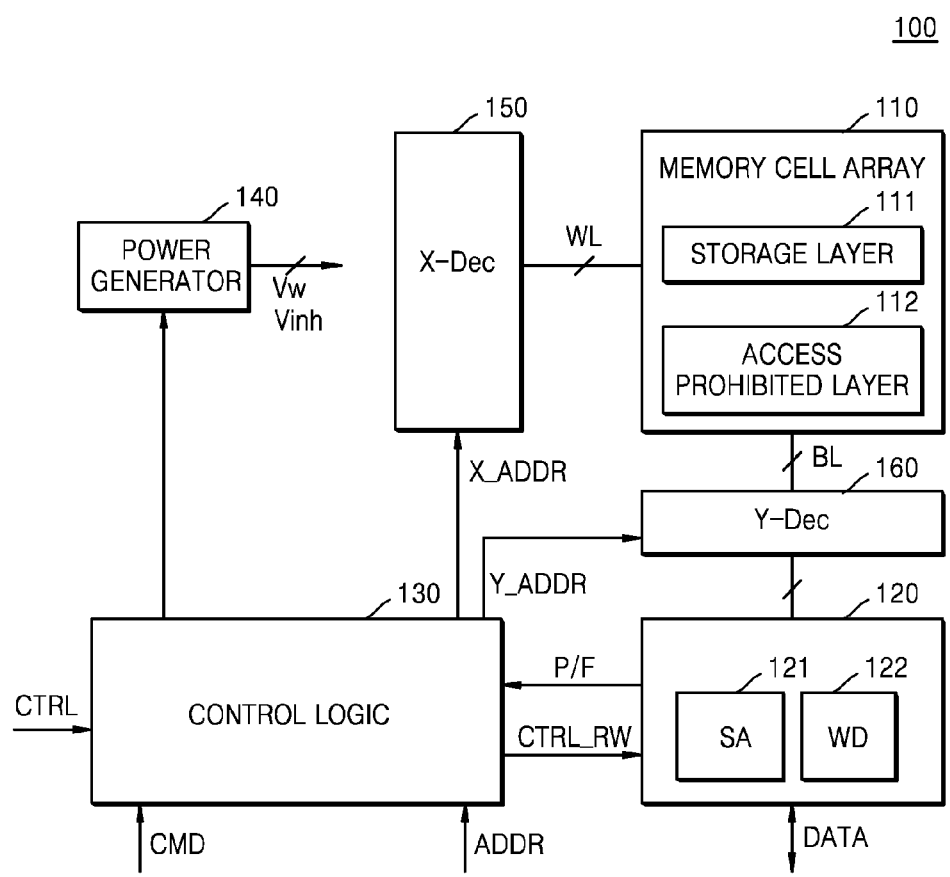
FIG. 2 is a block diagram further illustrating in one example the memory device 100 of FIG. 1.

FIG. 2 is a block diagram further illustrating on one example the memory device 100 of FIG. 1 according to an embodiment of the inventive concept.

Referring to FIG. 2, the memory device 100 includes in addition to the memory cell array 110, write/read circuit 120, and control logic 130, a power generator 140, a row decoder 150, and a column decoder 160. The write/read circuit 120 includes a sense amplifier 121 and a write driver 122. The memory cell array 110 is configured from a number of vertically stacked layers including multiple "storage layers" 111 and at least one "access-prohibited" layers 112. That is, among the standard layers fabricated and arranged to form the memory cell array 110, at least one of the standard layers is designated to function as an interference-free, storage layer 111, while at least one of the standard layers in the stacked plurality of layers is modified to function as an access-prohibited layer 112. In certain embodiments of the inventive concept, the access-prohibited will be specifically disconnected from the adjacent or proximate interference-free layer.

One possible structure and related method of operation for the memory device 100 shown in FIG. 2 are as follows.

To begin, it is understood that the memory cells included in the memory cell array 110 are accessed via first signal lines (e.g., bit lines, BL) and second signal lines (e.g., word lines, WL), as suggested above, using appropriately defined control voltages. In this context, the term "control voltages" is used to denote a class of control signals, whether specifically applied as voltages or currents, selectively applied via first and/or second signal lines to selected memory cells and non-selected memory cells during one or more memory access operations (e.g., read/write operations).

It is further assumed that an address ADDR indicating a selected memory cell is communicated with a command CMD, and includes a row address X_ADDR selecting word line(s) WL of the memory cell array 110 and a column address Y_ADDR selecting bit line(s) BL of the memory cell array 110. The row decoder 150 performs a word line selection operation in response to the row address X_ADDR, and the column decoder 160 performs a bit line selection operation in response to the column address Y_ADDR.

The write/read circuit 120 is connected to the bit lines BL and thus may write data to a selected memory cell, or may read data from the selected memory cell. For example, the write/read circuit 120 may receive a write/read voltage Vrw from the power generator 140, and the write driver 122 may provide the write voltage to the memory cell array 110 via the column decoder 160. Thus, when a set pulse is received, the write driver 122 may provide a set current or a set voltage to the memory cell array 110, in response to the set pulse. When a reset pulse is received, the write driver 122 may provide a reset current or a reset voltage to the memory cell array 110, in response to the reset pulse. During the set write operation, the write driver 122 may provide the memory cell array 110 with a set voltage to reduce a resistor value of the variable resistance of the memory cell, and during the reset write operation, the write driver 122 may provide the memory cell array 110 with a reset voltage so as to increase the resistor value of the variable resistance of the memory cell.

During a data read operation, the write/read circuit 120 provides the memory cell with a reading voltage, and the sense amplifier 121 may include a comparator that is connected to a node (for example, a sensing node) of a bit line in order to determine the data. One end of the comparator is connected to the sensing node, and the other end of the comparator is connected to a reference voltage to determine a value of the data. Also, the write/read circuit 120 may provide the control logic 130 with a pass/fail (P/F) signal according to a determination result of the read data. The control logic 130 may control the writing and read operations performed on the memory cell array 110 with reference to the P/F signal.

The control logic 130 may output various control signals CTRL_RW for writing data in the memory cell array 110 or for reading data from the memory cell array 110, based on the command CMD, the address ADDR, and the control signal CTRL transmitted from the memory controller 200. As such, the control logic 130 may control overall operations in the memory device 100.

With these assumptions in place, the respective layers included in the memory cell array 110 will share one or more common signal line connection(s) with one or more adjacent layer(s). For example, assuming a first layer disposed between a second layer and a third layer in the memory cell array 110, certain memory cells of the first and second layers may share connection with a word line, while memory cells of the first and third layers may share connection with a bit line. Accordingly, when memory cell(s) disposed in the second layer or the third layer are selected during an access operation, the memory cells disposed in the first layer and sharing the at least one signal line connection selected memory cells may suffer interference. That is, in order to perform (e.g.,) a read/write operation on selected memory cells disposed in the second layer, an appropriate control voltage (Vw) will be applied to corresponding selected signal lines connected to the selected memory cells. During the same access operation, an appropriate inhibited voltage (Vinh) will be applied to non-selected signal lines of the first and second layers connected to non-selected memory cells of the second layer as well as all of the non-selected memory cells disposed in the first layer. With this application of control voltages, however, the non-selected memory cells may be interfered with, and the resistance distribution of the non-selected memory cells may varied due to the interference. This result may badly affect data sensing margin(s) or the data retention characteristic of the affected memory cells.

According to the embodiment of the inventive concept illustrated in FIG. 2, the memory cell array 110 includes at least one of the storage layers 111 designated as an interference-free layer and at least another layer proximate to the interference-free layer designated as an access prohibited layer. Here, the access prohibited layer may be a layer proximate (or adjacent) to the interference-free layer, and normally sharing at least one signal line connection between memory cells of the interference-free layer and memory cells of the access prohibited layer. In this context, the phrase "normally sharing" means two or more proximate layers that as conventionally fabricated would include respective memory cells sharing connection to at least one signal line or set of signal lines. Thus, a standard layer may be assumed to be a layer that is conventionally designed, fabricated, interconnected via signal lines, and/or operated within a memory cell array of a resistive memory system. In contrast, an access prohibited layer is a layer that is physically fabricated in such a manner, physically altered in its signal line connections with respect to a standard layer, and/or electrically operated in such a manner to protect the memory cells of an interference-free layer from being interfered with.

Thus, the term "access prohibited layer" refers to a layer disposed in a vertical stack of layers forming a memory cell array and including memory cells that cannot be physically accessed and/or cannot be electrically accessed in such a manner so as to create appreciable interference with memory cells of an interference-free layer when one or more control voltages would otherwise be applied to selected memory cells of the access-prohibited layer. In this manner, the stability of memory cells in the interference-free layer may be ensured, and critical data may be safely stored in the interference-free layer.

Figure 3A:
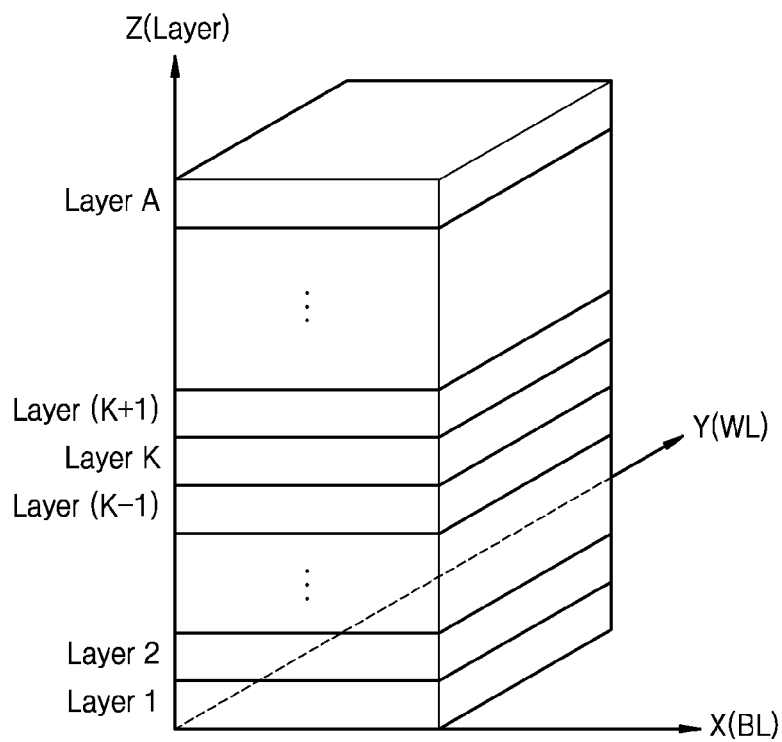
FIGS. 3A, 3B, 3C and 3D are respective diagrams further illustrating in several examples the memory cell array of FIG. 2.
Figure 3B:
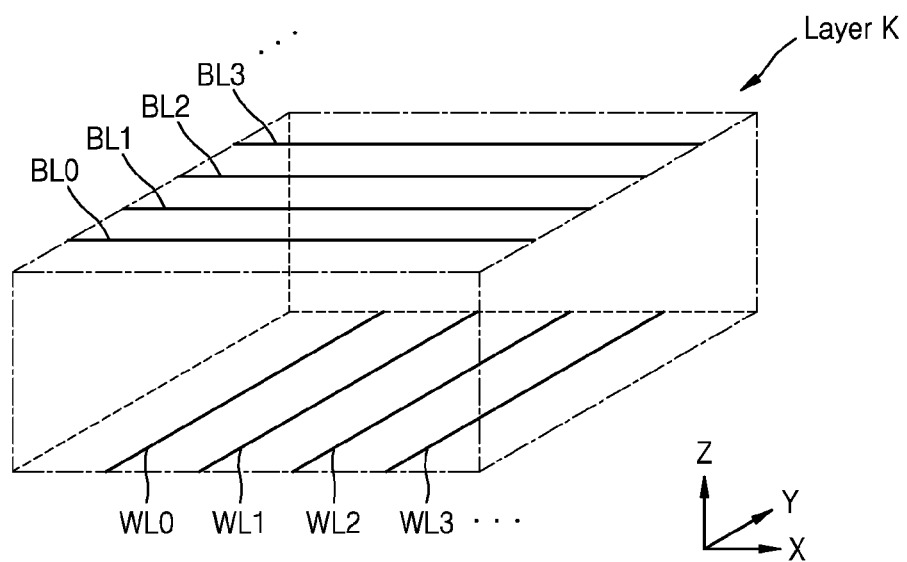
Figure 3C:
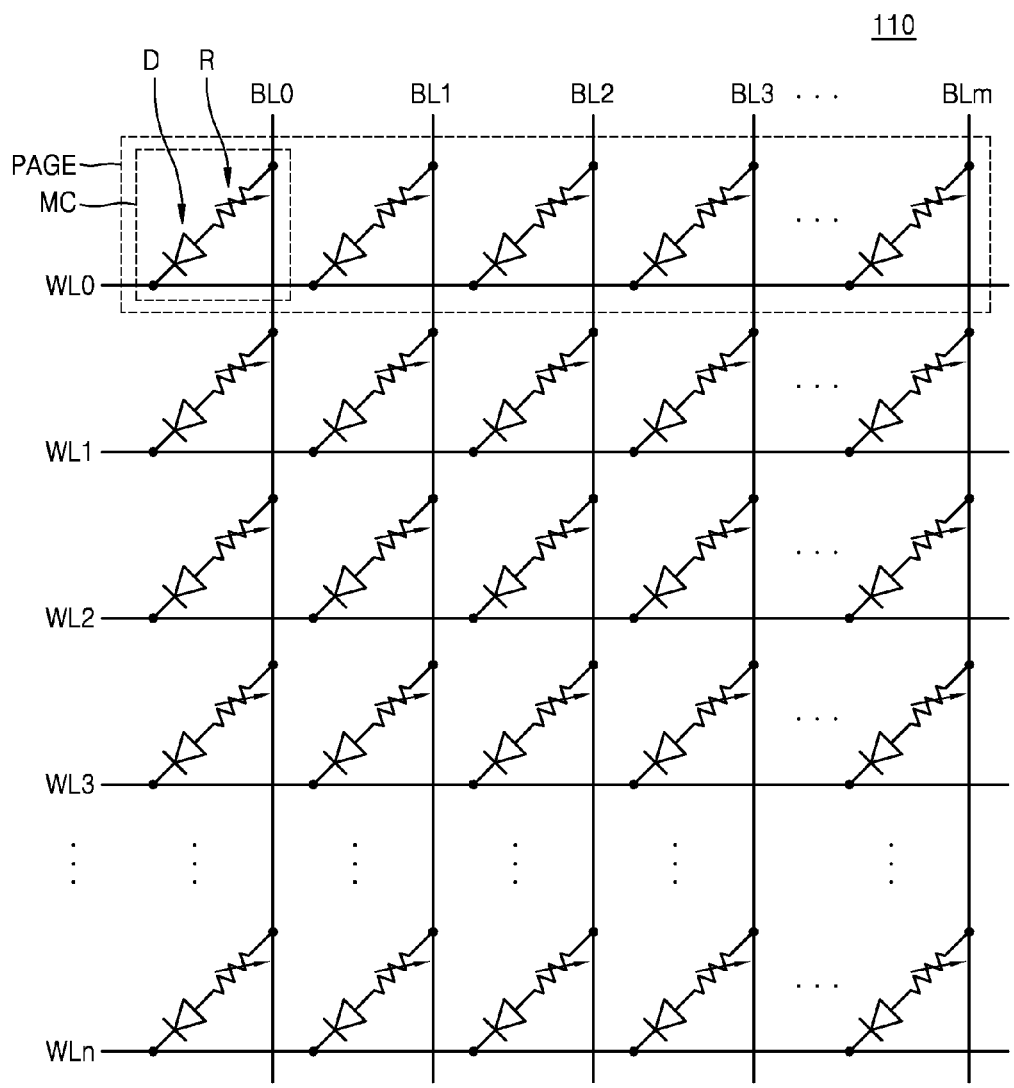
Figure 3D:
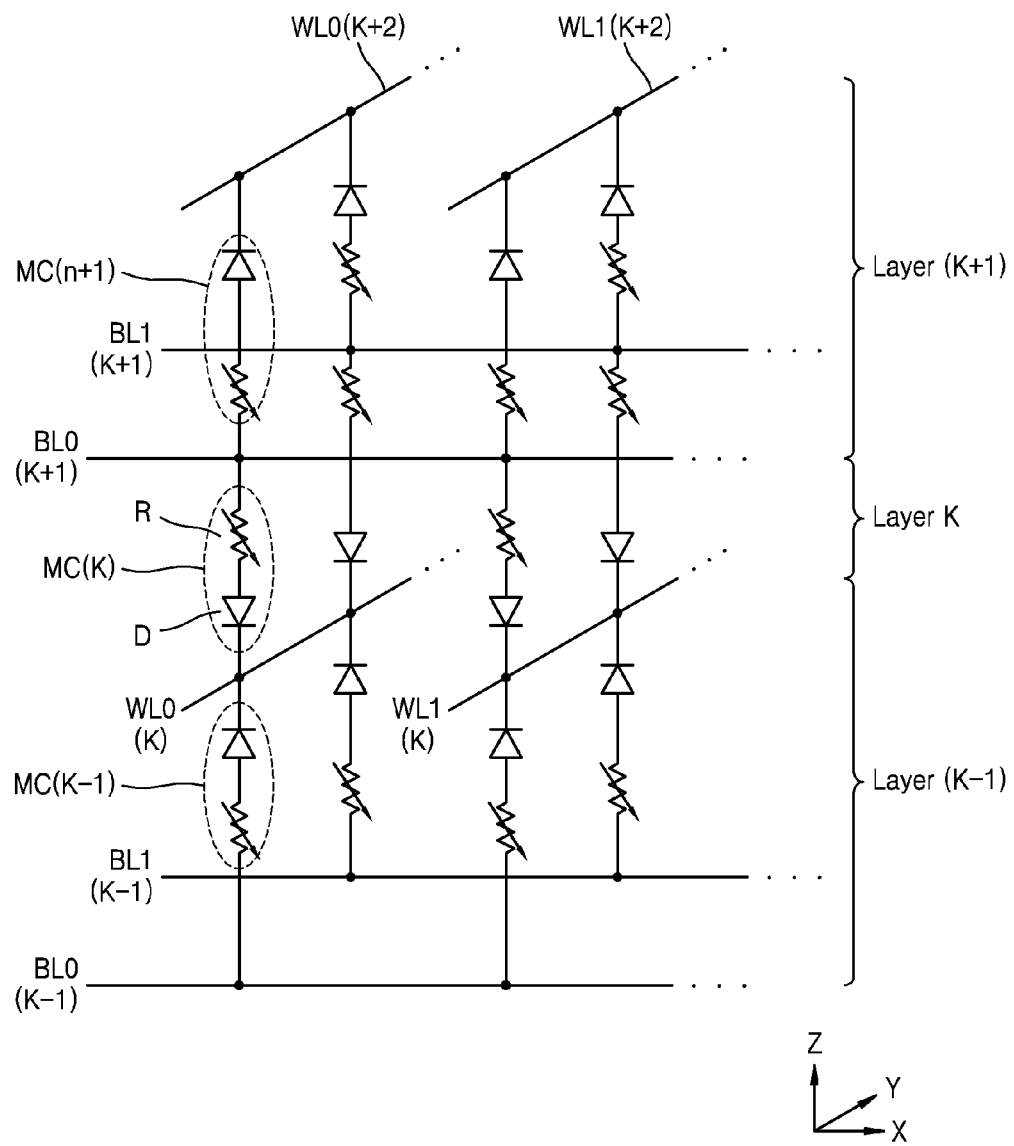

FIGS. 3A, 3B, 3C and 3D (hereafter, FIGS. 3A through 3D) are respective block diagrams and circuit diagrams showing various example of the memory cell array 110 of FIG. 2. FIG. 3A is a conceptual diagram illustrating a vertical memory cell array 110. FIG. 3B is a related conceptual diagram illustrating one possible arrangement of the word lines WL and bit lines BL in the layers of 3A. FIG. 3C is a circuit diagram further illustrating one possible arrangement of resistive memory cells in the memory cell array 110 of FIG. 3A, and FIG. 3D is a circuit diagram further illustrating in one example connections between memory cells in the vertically stacked memory cell array 110 of FIG. 3A.

Referring to FIG. 3A, the 3D memory cell array 110 includes 'A' two-dimensional memory layers arranged in an X-Y plane and stacked one on top of the other in a Z-axis direction ranging from a the lowermost layer (Layer 1) to an uppermost layer (Layer A), where bit lines BL are dispose in the X direction and word liens are disposed in the Y direction. Here, the Z direction may be a direction substantially perpendicular to a principle substrate (not shown) on which the memory cell array 110 is disposed.

At least one of the layers (e.g., layer K) is assumed to be designated as an interference-free layer, and at least one of the other layers proximate the interference-free layer (e.g., upper and lower physically adjacent layers, Layer K−1 and Layer K+1) are assumed to be designated as an access prohibited layers. Here, each of the adjacent layers Layer K−1 and Layer K+1 would conventionally be considered as an adjacent standard layer having memory cells that shared connection with at least one signal line connecting the memory cells of the Layer K.

Thus, as shown in FIG. 3B, word lines WL0, WL1, WL2, WL3, . . . and bit lines BL0, BL1, BL2, BL3, . . . are respectively disposed on a lower surface and an upper surface of each layer and cross each other in the X-Y plane of each layer. (Alternately, one of the bit lines and word lines might be arranged to extend in the Z direction). As a result, the word lines and bit lines of FIG. 3B might be conventionally are arranged across the K layers such that they are "shared" between all of the layers including Layer K−1 and Layer K+1.

Referring to FIG. 3C, the memory cell array 110 is assumed to include the foregoing layers, word lines and bit lines arranged to operatively provide access to a vast number of memory cells MC. The number of word lines WL, the number of bit lines BL, and the number of memory cells MC may vary depending on specific design, and various groups (e.g., "pages") of the memory cells MC may be simultaneously accessed using the same word line WL.

According to the embodiment illustrated in FIG. 3C, each of the memory cells MC includes a variable resistive element R and a selection device D. Here, the variable resistive element R may be referred to as a variable resistance material, and the selection device D may be referred to as a switching device.

In one embodiment, the variable resistive element R is connected to between one of the plurality of bit lines BL1 through BLm and the selection device D, and the selection device D may be connected between the variable resistive element R and one of the plurality of word lines WL1 through WLn. However, one or more embodiments of the inventive concept are not limited thereto, that is, the selection device D may be connected to one of the plurality of bit lines BL1 through BLm and the variable resistive element R and the variable resistive element R may be connected between the selection device D and one of the plurality of word lines WL1 through WLn.

The selection device D may be connected between one of the plurality of word lines WL1 through WLn and the variable resistive element R, and may control supply of the current to the variable resistive element R according to voltages applied to the connected word line and the bit line. In FIG. 3C, the selection device D is shown as a diode; however, one or more embodiments of the inventive concept are not limited thereto, that is, the selection device D may be a device that may be switched, In FIG. 3D, conceptually arranged behind each reference number denoting each element, a number of the layer including the corresponding element is additionally indicated in parentheses. For example, a memory cell MC(K) denotes a memory cell MC included in Layer K.

Referring to FIG. 3D, the Layer K−1, Layer K, and Layer K+1 are stacked with respect to each other. Each one of Layer K−1, Layer K, and Layer K+1 includes a plurality of memory cells MC(K−1), MC(K), and MC(K+1), as well as the word lines WL0 and WL1 and the bit lines BL0 and BL1 respectively connected to opposite ends of the string of memory cells MC. Hence, vertically adjacent layers share word line and bit line connections. For example, as shown in FIG. 3D, Layer K and Layer K+1 share connections to bit lines BL0 (K+1) and BL1(K+1). Layer K and Layer K−1 also share connections to word lines WL0(K) and WL1(K). However, these are just two simple examples of a great variety of shared signal line connections that memory cells disposed in proximate, vertically stacked layers in a memory cell array might experience.

Referring to FIG. 3D, Layer K−1 may be selected and a set voltage (or a reset voltage) is applied thereto, and an inhibited voltage may therefore be applied to Layer K. In such a case, since a voltage difference is generated between opposite ends of the memory cell MC in Layer K, leakage current may conventionally occur. However, according to certain embodiments of the inventive concept, assuming that Layer K is designated as an interference-free layer, access of memory cells in adjacent Layer K−1 and/or memory cells in Layer K+1 need not cause leakage current in relation to memory cell in Layer K. Thus, when applying a control voltage to Layer K (e.g., an inhibit voltage assuming that Layer K is non-selected), another voltage applied at the opposite end of implicated memory cells will be substantially the same. Accordingly, the likelihood interference occurring in Layer K may be reduced.

Figure 4A:
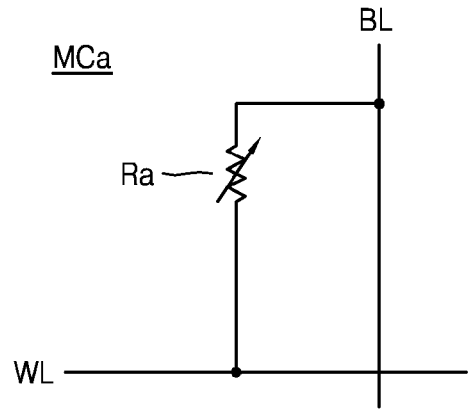
FIGS. 4A, 4B and 4C are respective circuit diagrams further illustrating examples of the memory cell that may be included in the memory cell array of FIG. 2.
Figure 4B:
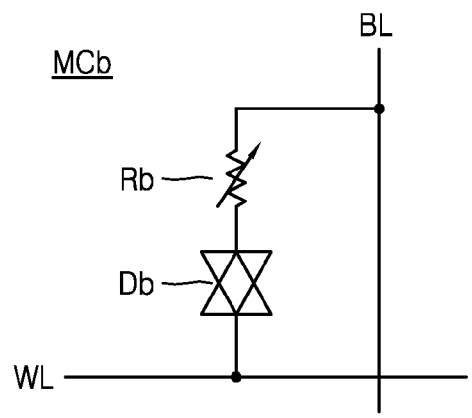
Figure 4C:
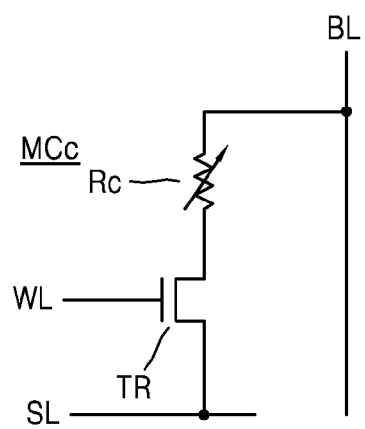

FIGS. 4A, 4B and 4C are respective circuit diagrams illustrating possible examples for the memory cells MC included in the memory cell array 110 of FIG. 2.

Referring to FIG. 4A, a memory cell MCa includes a variable resistor Ra, and the variable resistor Ra may be connected between the bit line BL and the word line WL. The memory cell MCa may store data by the voltages applied respectively to the bit line BL and the word line WL.

Referring to FIG. 4B, a memory cell MCb may include a variable resistor Rb and a bidirectional diode Db. The variable resistor Rb may include a resistance material for storing data. The bidirectional diode Db is connected between the variable resistor Rb and the word line WL, and the variable resistor Rb may be connected between the bit line BL and the bidirectional diode Db. Locations of the bidirectional diode Db and the variable resistor Rb may be exchanged with each other. A leakage current flowing in the non-selected resistive memory cells may be reduced by the bidirectional diode Db.

Referring to FIG. 4C, a memory cell MCc may include a variable resistor Rc and a transistor TR. The transistor TR may be a selection device, that is, a switching device, for supplying or blocking the current to the variable resistor Rc according to the voltage of the word line WL. In the example of FIG. 4C, a source line SL for adjusting voltage levels at opposite ends of the variable resistor Rc may be additionally disposed, in addition to the word line WL. The transistor TR is connected between the variable resistor Rc and the source line SL, and the variable resistor Rc may be connected between the bit line BL and the transistor TR. Locations of the transistor TR and the variable resistor Rc may be exchanged with each other. The memory cell MCc may be selected or not selected according to whether the transistor TR driven by the word line WL is turned on or turned off.

Figure 5:
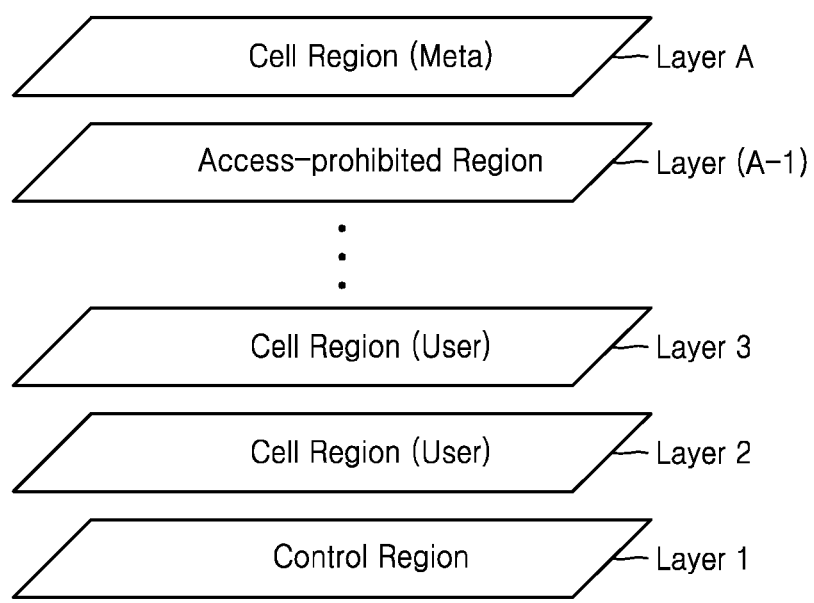
FIG. 5 is a conceptual diagram illustrating a possible arrangement of layers in the memory cell array of FIG. 2.

FIG. 5 is a conceptual diagram further illustrating in one example a configuration of the layers that may be included in the memory cell array 110 of FIG. 2.

Here, the memory cell array 110 is assumed to include Layer 1 through Layer A, where Layer A (an uppermost layer in the illustrated configuration) is further assumed to be an interference-free layer and lower adjacent Layer A-1 is assumed to an access prohibited layer.

The remaining storage layers (e.g., Layer 1, Layer 2, Layer 3, etc.) arranged below Layer A-1 are assumed to be standard layers used to store user data, where the lowermost Layer 1 is still further assumed to be a control layer including peripheral circuits. With these assumptions in place, Layer A-1 will be physically separated and/or electrically operated in relation to Layer A, such a manner that access to or conventionally potential access to (or access biasing of) memory cells in the Layer A-1 (the access prohibited layer) will not interfere with memory cells disposed in the Layer A (the interference-free layer).

In this context, Layer A and Layer A-1 may be physically or electrically segregated in a variety of ways. For example, access to memory cells in Layer A-1 may be electrically prevented using an address management scheme (e.g., a layer selection control scheme overlaid upon a conventional address management scheme) that precludes selected of memory cells in Layer A-1. Alternately, one or more connectivity-necessary process(es) conventionally used to fabricate the layer might be selectively omitted during the fabrication of layer A-1, or Layer A-1 might be subjected to one or more connectivity-destructive processes as compared with the other layers. In this context, "connectivity" refers to the electrical connectivity between memory cells in Layer A and memory cells in Layer A-1 that would normally exist via one or more shared signal lines. Such an omitted connectivity-necessary process or an added connectivity-destructive process may be directed to the selection device and/or the variable resistive element of the memory cells in layer A-1, for example.

Figure 6:
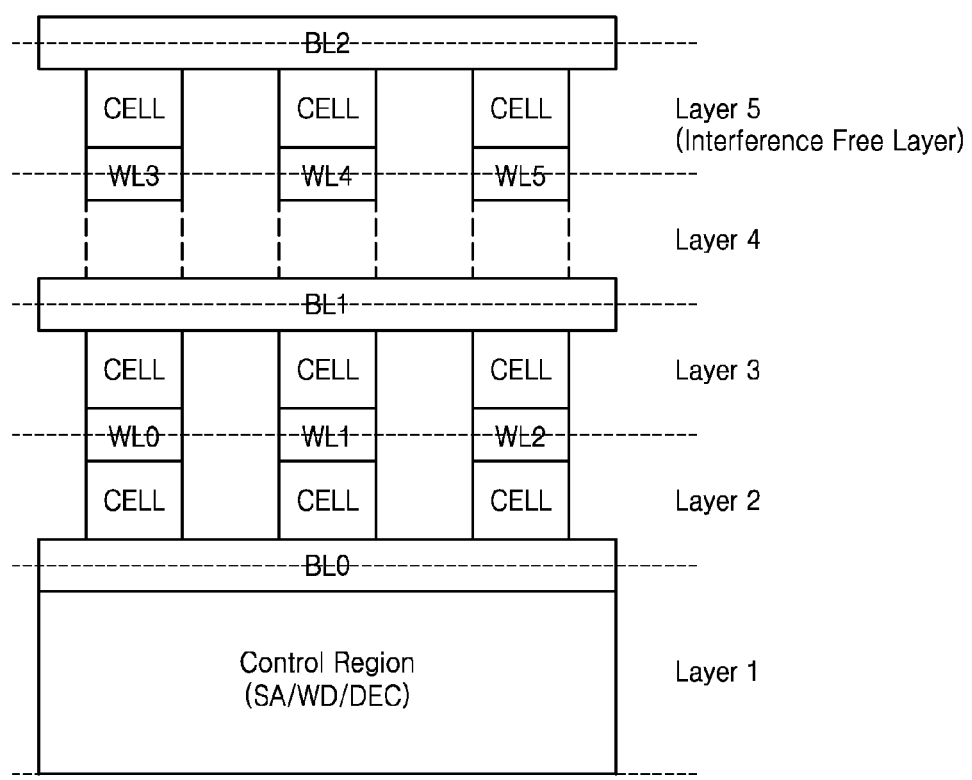
FIG. 6 is a cross-sectional diagram further illustrating in one example the provision of an interference-free layer in the memory cell array of FIG. 2.

FIG. 6 is a diagram illustrating in one example the provision of an interference-free layer in a memory cell array of an embodiment of the inventive concept. In FIG. 6, a first layer corresponding to the control layer, and second through fifth layers Layer 2 through Layer 5 corresponding to memory layers included in the memory cell array 110 are shown. The control Layer 1 may include various peripheral circuits relating to the memory operation, such as a sense amplifier, a write driver, and a decoder.

Also, Layer 1 through Layer 5 share word lines and/or bit lines with each other. For example, Layer 1 and Layer 2 may share bit line BL0, and Layer 2 and Layer 3 may share word lines WL0 through WL2. Similarly, Layer 3 and Layer 4 may share bit line BL1, while Layer 4 and Layer 5 may share the word lines WL3 through WL5.

Since at least one of Layer 2 through Layer 5 is designated as an interference-free layer, important data may be better secured. For example, Layer 5 may be designated as the interference-free layer, and Layer 4 sharing word lines WL3 through WL5 with Layer 5 may be designated as an access prohibited layer.

In order to designated Layer 5 as the interference-free layer, Layer 4 is assumed to be physically separated from Layer 5. For example, one or more connectivity-necessary processes used to otherwise form the variable resistive layer and/or the selection device included in the memory cells of Layer 4 may omitted. The dotted region indicated in FIG. 6 for Layer 4 is a region in which the memory cells are arranged, and at least one connectivity-necessary process otherwise used to form the memory cells is assumed to be omitted.

As a result of this intentional malformation of memory cells in Layer 4, data will not (and cannot) be stored in Layer 4. Additionally or alternately, valid physical addresses may not be allocated for the memory cells of Layer.

Figure 7A:
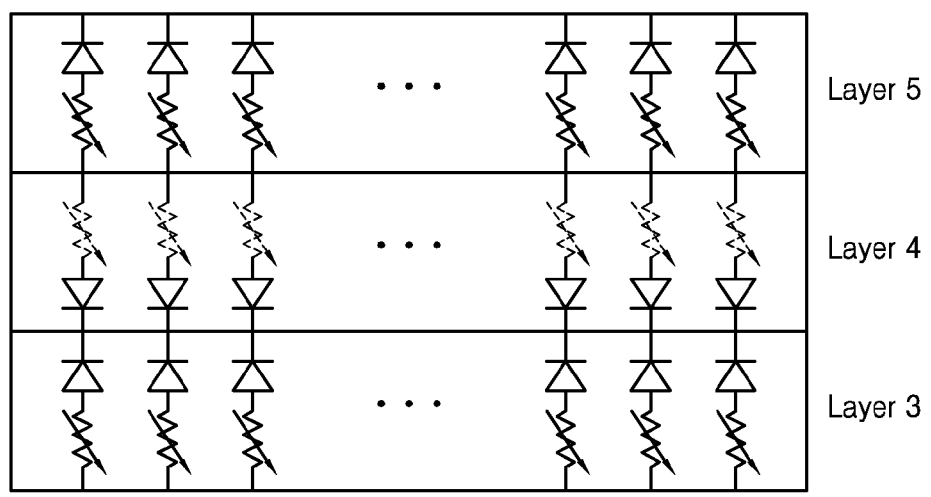
FIGS. 7A, 7B and 7C are respective circuit diagrams further illustrating different approaches to the provision of an access prohibition layer in the memory cell array of FIG. 2.
Figure 7B:
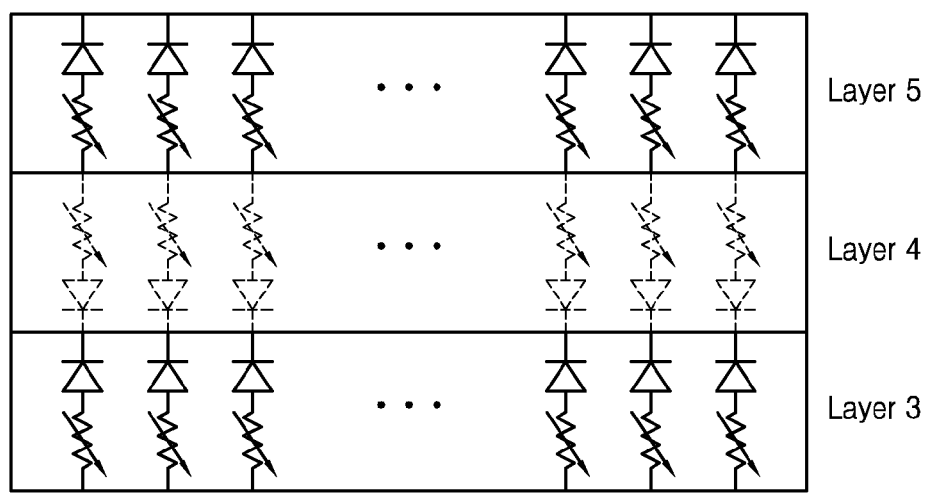
Figure 7C:
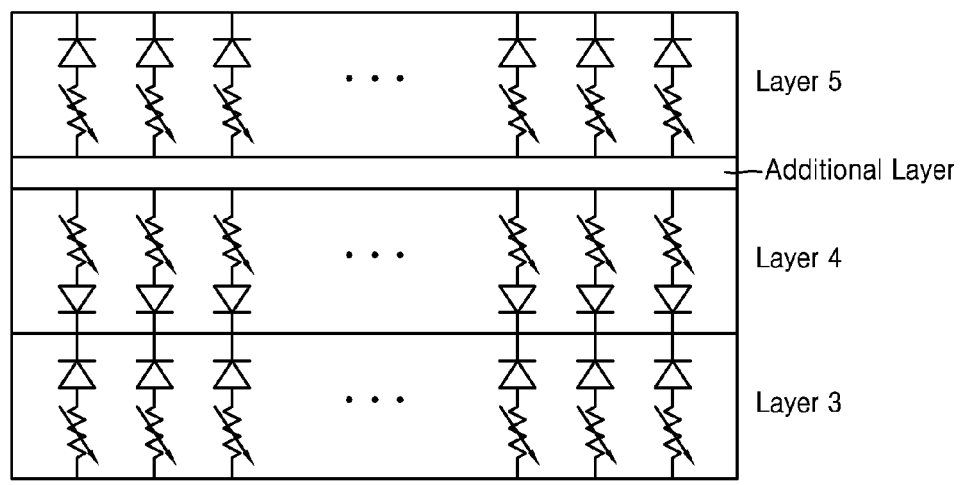

FIGS. 7A, 7B, and 7C are respective circuit diagrams illustrating examples of providing an access prohibited layer in a memory cell array of an embodiment of the inventive concept. FIGS. 7A and 7B show examples of forming the access prohibited layer by skipping one or more connectivity-necessary processes, and FIG. 7C shows an example of forming the access prohibited layer by adding one or more connectivity-destructive processes.

As shown in FIG. 7A, Layer 5 is again assumed to be designated as an interference-free layer, and Layer 4 sharing at least one signal line with Layer 5 is assumed to be designated as an access prohibited layer.

Accordingly, one or more connectivity-necessary processes used to normally provide memory cells (variable resistive device and/or selection device) in Layer 4 is omitted. Thus, in FIG. 7A, a process forming the variable resistive device is omitted, and memory cells in Layer 4 will not include a constituent variable resistive device. In FIG. 7B, process(es) forming the variable resistive device and the selection device are omitted, and memory cells in Layer 4 will not include either a variable resistive device or a selection device. By omitting one or more connectivity-necessary process(es), Layer 4 is effectively physically separated from Layer 5, and access operations directed (on purpose or inadvertently) to memory cells in Layer 4 will not interfere with the resistance state of memory cells in Layer 5.

Alternately, according to the example shown in FIG. 7C, one or more connectivity-destructive processes may be additionally applied to Layer 4 or during the fabrication of the memory cell array in relation to Layer 4. For example, after performing the processes necessary to provide the memory cells in the Layer 4, an additional process may be added that effectively segregates Layer 4 memory cells from Layer 5 memory cells. The additional connectivity-destructive process(es) may include, for example, the formation of an oxidation layer on Layer 4.

Figure 8:
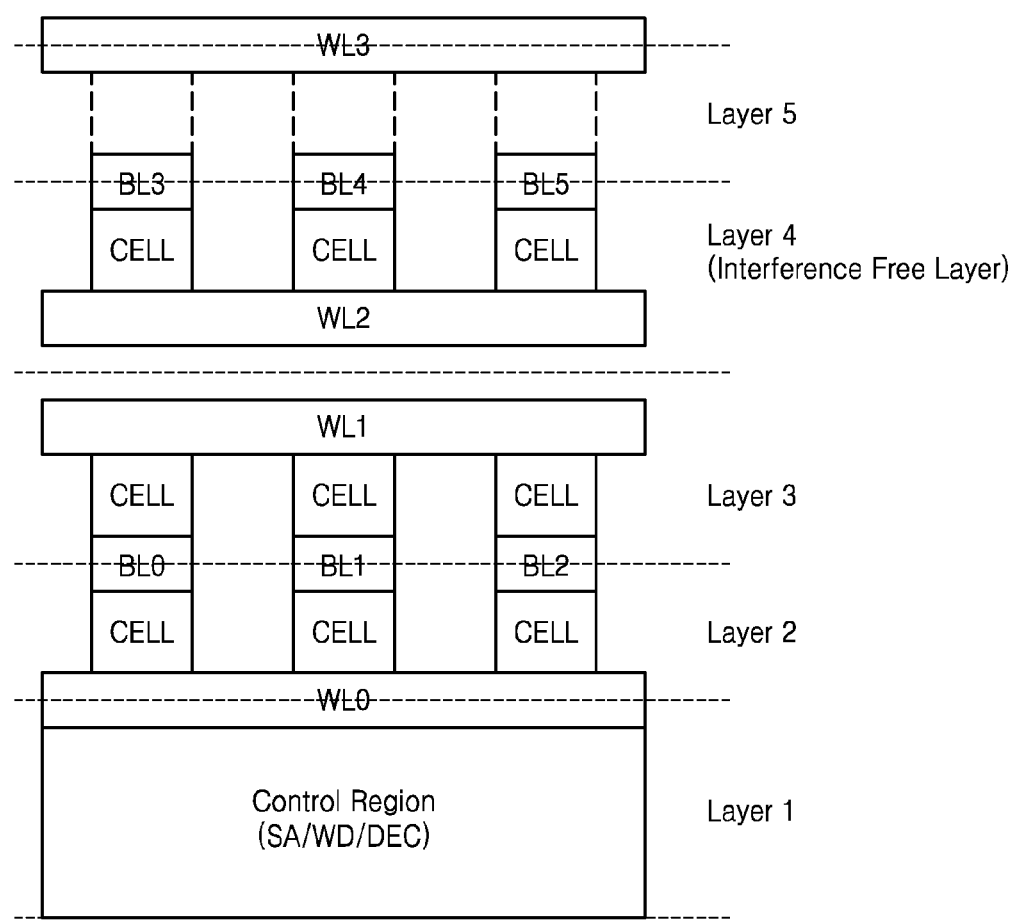
FIGS. 8 and 9 are respective cross-sectional diagrams further illustrating in other examples the provision of an interference-free layer in the memory cell array of FIG. 2.

FIG. 8 is a diagram illustrating in one example the provision of an interference-free layer in a memory cell array of an embodiment of the inventive concept. A pair of layers (Layer 4 and Layer 5) sharing bit lines (BL3 through BL5) are shown in FIG. 8, where Layer 4 is designated as an interference-free layer.

Layer 2 and Layer 3 are used as standard storage layers storing various kinds of data, such as user data. In addition, metadata is also stored in the Layer 2 and Layer 3.

Since Layer 4 is designated as an interference-free layer providing increased data security, Layer 5 may be designated as an access prohibited layer that is physically separated from Layer 4.

Figure 9:
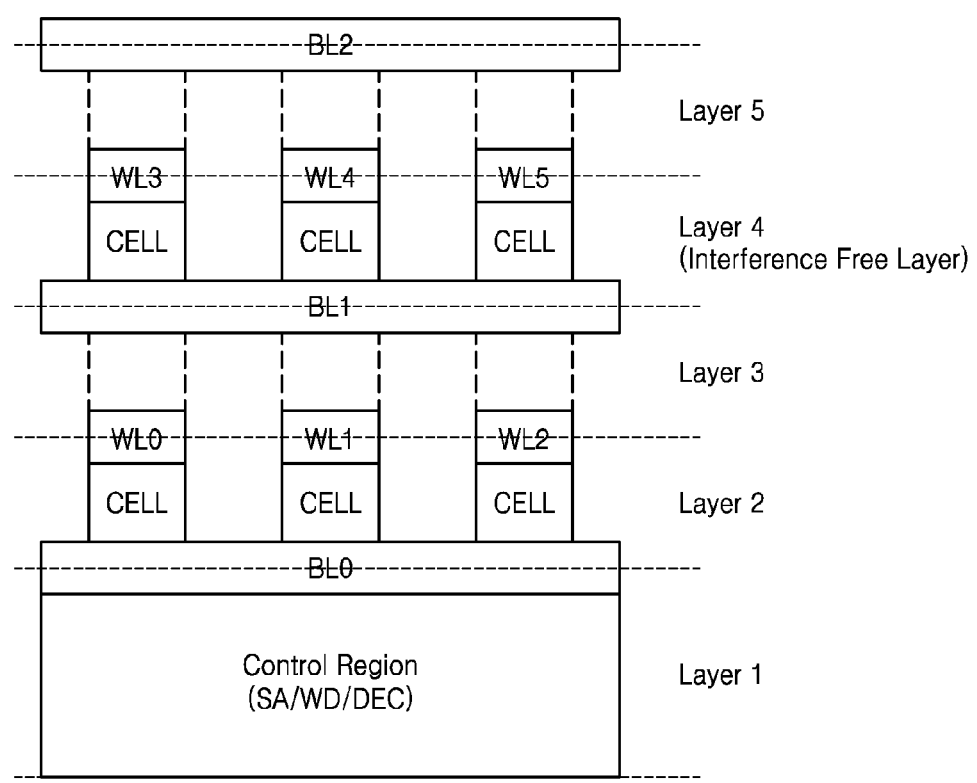

FIG. 9 is a diagram illustrating in one example the provision of an interference-free layer in a memory cell array of an embodiment of the inventive concept. In FIG. 9, Layer 4 is again designated as an interference-free layer. However, Layer 4 normally shares word lines WL3 through WL5 with Layer 5, and bit line BL1 with Layer 3. Since Layer 4 is designated as the interference-free layer, both Layer 3 and Layer 5 may be designated as access prohibited layers. Any one of the foregoing approaches may be used to effectively segregate Layer 3 and Layer 5 from Layer 4.

Figure 10:
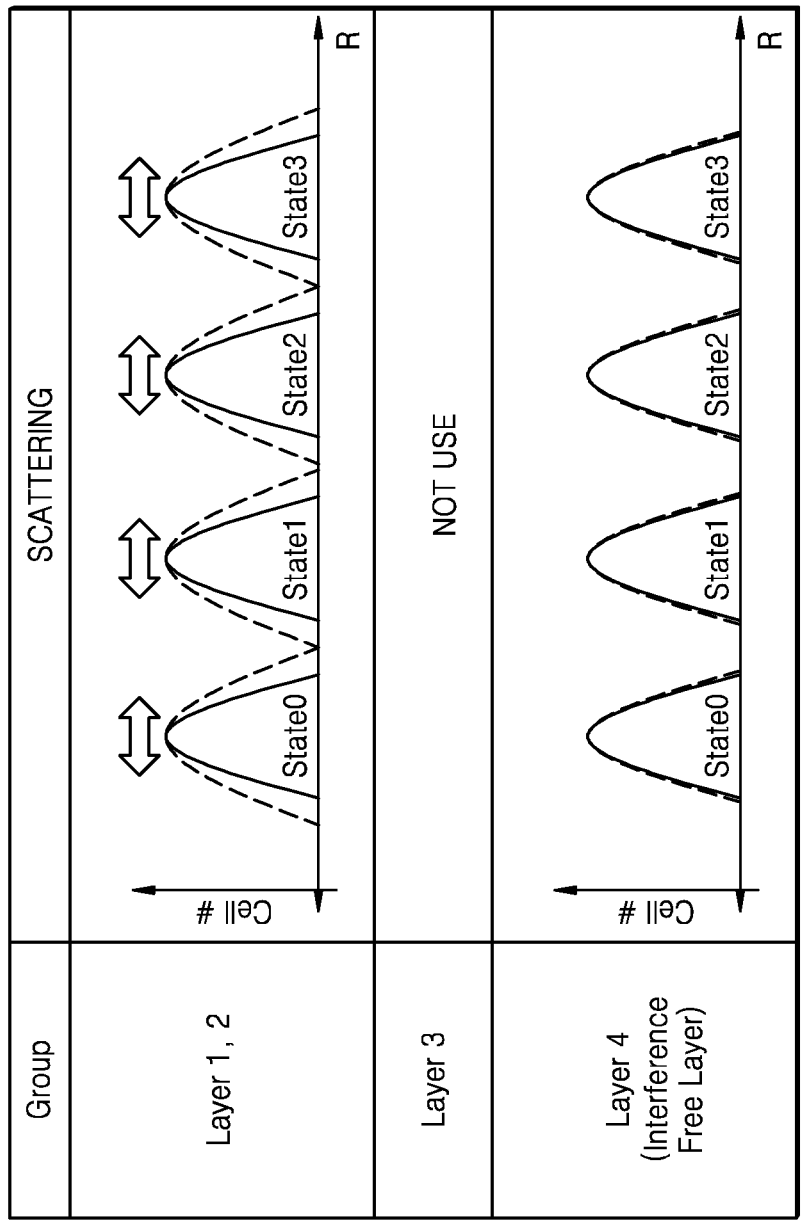
FIG. 10 is a graph illustrating possible variation in resistance distributions for memory cells arranged in an interference-free layer according to various embodiments of the inventive concept as compared with memory cells arranged in a more conventional layer.

FIG. 10 is a conceptual graph illustrating possible variations in the resistance distribution of memory cells disposed in standard Layers 1 and 2, access prohibited Layer 3 and interference-free Layer 4 of a memory cell array according to an embodiment of the inventive concept.

As shown in FIG. 10, access operations are effectively prohibited with respect to memory cells of Layer 3 (the access prohibited layer). In contrast, memory cells in Layer 1 and Layer 2 have resistance distributions according to data writing states that are capable of being interfered with during the execution of access operations directed to memory cells dispose din other layers sharing at least one signal line, as denoted by a dotted line. However, since Layer 4 is not interfered with by access operations directed to other layers sharing at least one signal line, the range of resistance distribution variation is relatively small.

Figure 11:
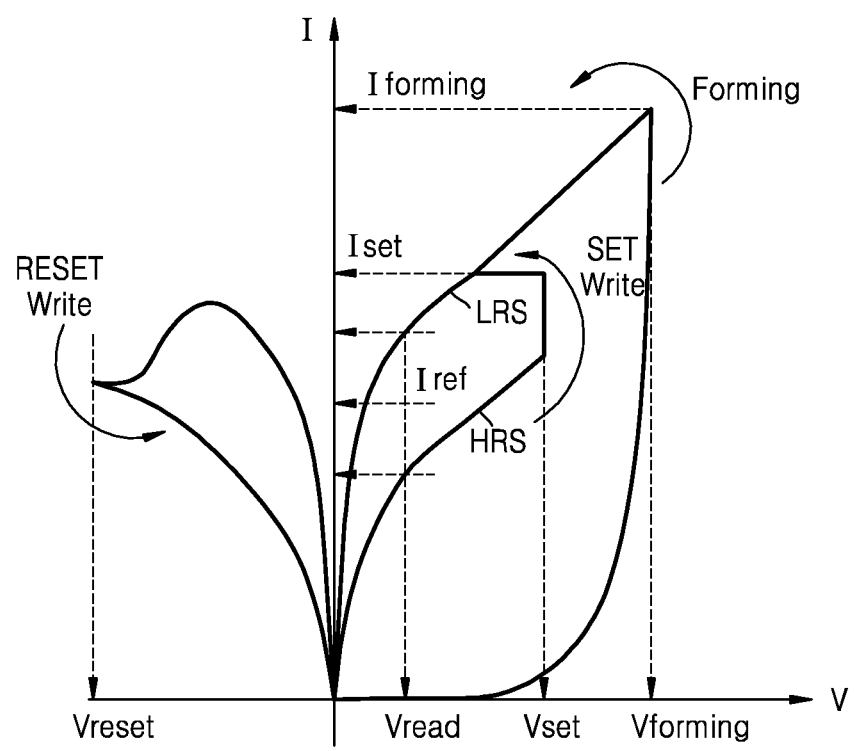
FIG. 11 is a graph illustrating current-voltage characteristic for a bidirectional resistive memory cell.

FIG. 11 is a current-voltage characteristic graph illustrating a bidirectional type resistive memory cell that may be used in certain embodiments of the inventive concept.

As shown in FIG. 11, when a set current Iset corresponding to the set voltage Vset is applied to the memory cell in a set write operation, a resistance state of the variable resistance of the memory cell may be changed from a high resistive state (HRS) to a low resistive state (LRS). Also, when a magnitude of the reset voltage Vreset applied to the memory cell in a reset write operation is restricted so that the resistance state of the variable resistance of the memory cell may be changed from the LRS to the HRS. In addition, in a read operation, when a predetermined read voltage Vread is applied to the memory cell, a reading current corresponding to the state of the variable resistance of the memory cell is generated. Then, data may be determined by comparing the read current to a reference current Iref.

In addition, when a memory cell is formed through memory cell processes, a forming process may be performed on the memory cell so that the memory cell may normally store the data. The forming process is a process of generating a filament in the memory cell at an initial stage, in which the filament that is a path flowing the current in the memory cell is not formed yet, by applying high voltage and high current to the memory cell. During the forming process, a forming voltage Vforming that is greater than the set voltage Vset and a forming current Iforming according to the forming voltage Vforming may be applied to the memory cell in order to generate the filament.

FIG. 9 is a diagram illustrating in one example the provision of an interference-free layer in a memory cell array of an embodiment of the inventive concept. In FIG. 12, Layer 1 is again assumed to be a control layer. Layer 5 is assumed to be designated as an interference-free layer, and Layer 4 is therefore designated as an access prohibited layer. Since Layer 5 and Layer 4 are electrically separated from each other, the conventionally expected variations in resistance distribution for memory cells dispose din Layer 5 as the result of interference caused by the peripheral circuits of Layer 1, as well as interference caused by access to the memory cells of Layer 2 and Layer 3 will be markedly reduced.

Figure 12:
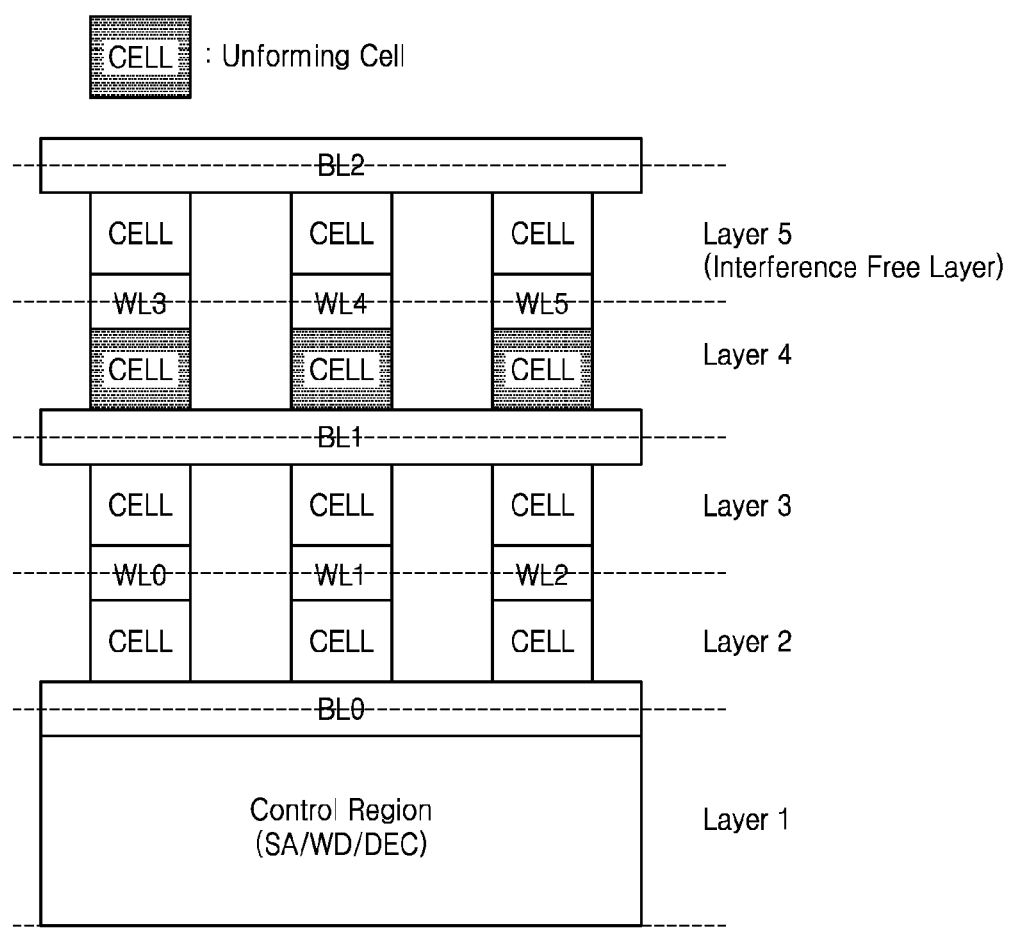
FIG. 12 is a cross-sectional diagram further illustrating in another example the provision of an interference-free layer in the memory cell array of FIG. 2.

FIG. 12 shows an example wherein the access prohibited layer (Layer 4) is physically adjacent to the interference-free layer (Layer 5). However, this need not always be the case. For example, in certain embodiments of the inventive concept, Layer 5 as the interference-free layer may be operationally or electrically proximate a non-physically adjacent layer. According certain embodiments of the inventive concept may designate one or more layer that are non-physically adjacent to a designated interference-free layer as access prohibited layer(s).

Figure 13:
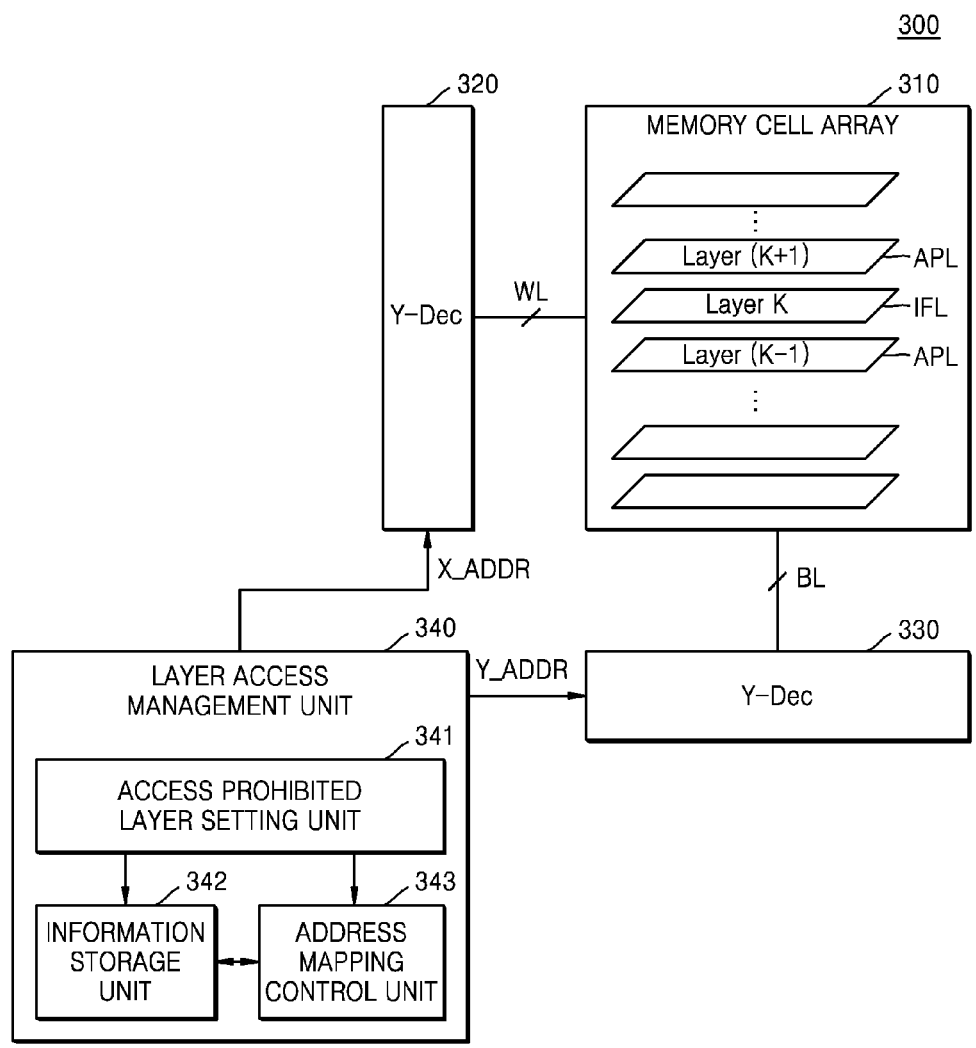
FIG. 13 is a block diagram illustrating in one example a memory device according to certain embodiments of the inventive concept.

FIG. 13 is a block diagram illustrated a memory device 300 according to another embodiment of the inventive concept. In relation to FIG. 13, an example of minimizing memory cell interference for an interference-free layer through address management (e.g., layer selection) will be described.

Here, memory device 300 includes a memory cell array 310, a row decoder 320, and a column decoder 330. Also, the memory device 300 may further include a layer access management unit 340. Also, the layer access management unit 340 may include an access prohibited layer setting unit 341, an information storage unit 342, and an address mapping control unit 343. The memory cell array 310 includes a plurality of layers each including memory cells. From among these layers, layer K is designated as an interference-free layer (IFL), while Layer K−1 and Layer K+1 are designated as access prohibited layers (APL). Although not shown in FIG. 13, the memory device 300 further includes peripheral circuits performing access operation, such as the write/read circuit, control logic, and control voltage generator previously described. Also, in FIG. 13, the layer access management unit 340 is distinguished from the control logic of FIG. 2. However, at least some of the functions performed by the layer access management unit 340 may be performed in other embodiments of the inventive concept by analogous control logic.

According to the embodiment shown in FIG. 13, since an interference-free layer is designated that shares one or more signal line connections with other layers, both upper and lower adjacent layer are designated as access prohibited layers. However, unlike the former examples, the access prohibited layers are enforced not by physical disconnection, but by address management policy. For example, if a memory cell normally selected by an access request (i.e., address-identified by the access request) is disposed in an access prohibited layer, the address will be converted into another address that accesses a "substitute" memory cell disposed in some other non-access prohibited layer.

Thus, the access prohibited layer setting unit 341 sets one or more layers as the access prohibited layers according to signal line connection relationships between the layers included in the memory cell array 310. For example, Layer K is designated as the interference-free layer, Layer K−1 and Layer K+1 sharing at least one signal line with Layer K will be designated as access prohibited layers. The access prohibited layer setting unit 341 therefore manages write information that precludes physically writing data to memory cell(s) in the access prohibited layer.

For example, the information storage unit 342 may store information identifying access prohibited layer. In this case, the information storage unit 342 may store information representing location of the cell region, to which the access is prohibited, in the access prohibited layer APL. In the example of FIG. 13, the information storage unit 342 is disposed on an outside of the memory cell array 310; however, the information storage unit 342 may be located in a part of the memory cell array 310.

The address mapping control unit 343 may control the access prohibited layer based on an address conversion operation, so that the access prohibited layer is not accessed. For example, the address mapping control unit 343 compares an address received from outside with the information stored in the information storage unit 342, so as to determine whether the memory cell that is to be accessed is located in the access prohibited layer. If it is determined that the access request to the access prohibited layer is received, the address mapping control unit 343 may control the memory cells in other layers to be accessed through the address conversion operation. A row address X_ADDR and a column address Y_ADDR that are converted may be provided respectively to the row decoder 320 and the column decoder 330. For example, the converted row address X_ADDR may include information for selecting the layer, and the selection of the may be blocked according to the information.

Figure 14A:
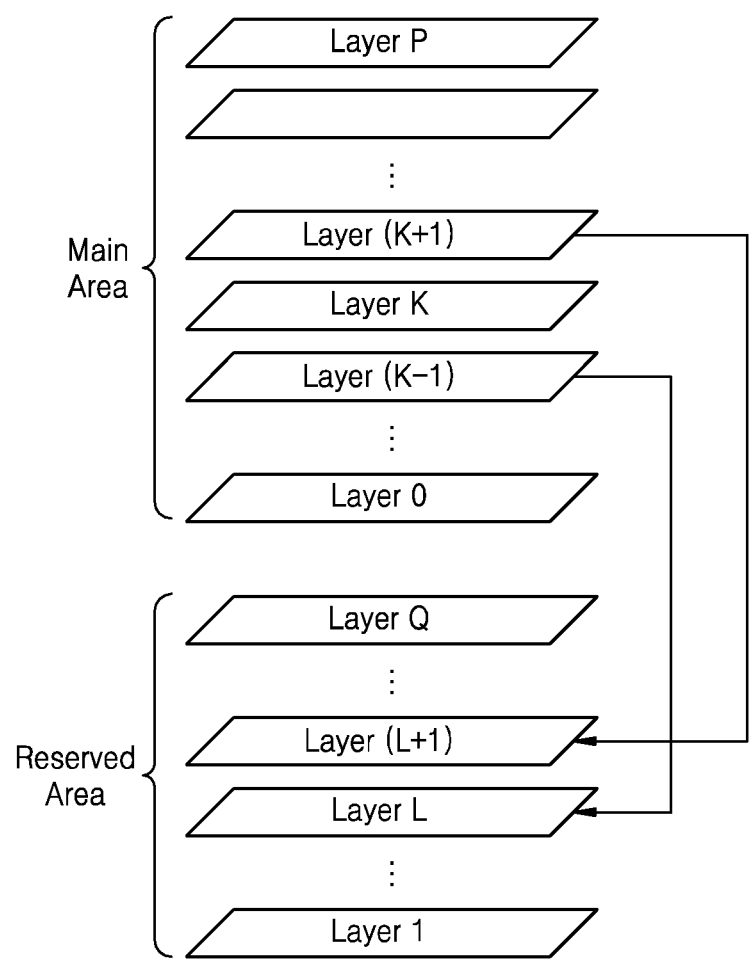
FIGS. 14A, 14B, 15, 16 and 17 are respective diagrams variously illustrating possible variations in the design, arrangement, layout and/or use of a memory cell array like the ones shown in FIGS. 2 and 13.
Figure 14B:
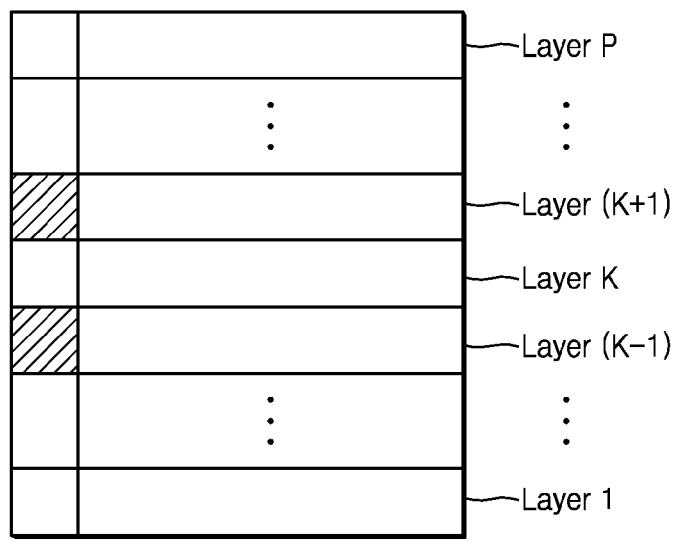

FIGS. 14A and 14B are respective conceptual diagrams showing examples of the memory cell array 310 of FIG. 13.

Referring to FIG. 14A, the memory cell array 310 includes a main area including a plurality of layers, and a reserved area including one or more layers that may be used to substitute for the access prohibited layers included in the main area. In the example shown in FIG. 14A, the main area includes Layer 0 through Layer P, and the reserved area includes Layer 1 through Layer Q.

According to the above embodiment, at least one layer in the main area may be designated as an interference-free layer that shares at least one signal line with an access prohibited layer. For example, in FIG. 14A, Layer K in the main area is assumed to be designated as the interference-free layer, and Layer K−1 and Layer K+1 are designated as access prohibited layers.

According to an established address conversion policy therefore, the memory cells of Layer K−1 and the memory cells of Layer K+1 will be "substituted for" (i.e., effectively replaced in the context of access operations) by memory cells disposed in the reserved area. For example, Layer K−1 memory cells may be substituted for using Layer L memory cells in the reserved area, and Layer K+1 memory cells may be substituted for using Layer L+1 memory cells. Thus, when a received address indicates memory cell(s) in an access prohibited layer, the indicated memory cells may be functionally provided from another substitute layer of a reserved area using an address conversion policy. Here, memory cells in layers of the reserved area may also be used to substitute for defective memory cells in non-access prohibited layers.

In addition, as shown in FIG. 14B, information indicating access prohibited layer(s) may be written in the access prohibited layer of the main area. For example, a certain pattern representing that the corresponding layer is the access prohibited layer may be marked in a part of a page in each of Layer 1 through Layer P of the main area. At an initial stage of operating the memory device 300, information written in a partial region of Layer 1 through Layer P is read, and locations of the access prohibited layers may be determined according to the reading result, and after that, the address conversion operation may be performed with reference to the read information in the memory operation.

Figure 15:
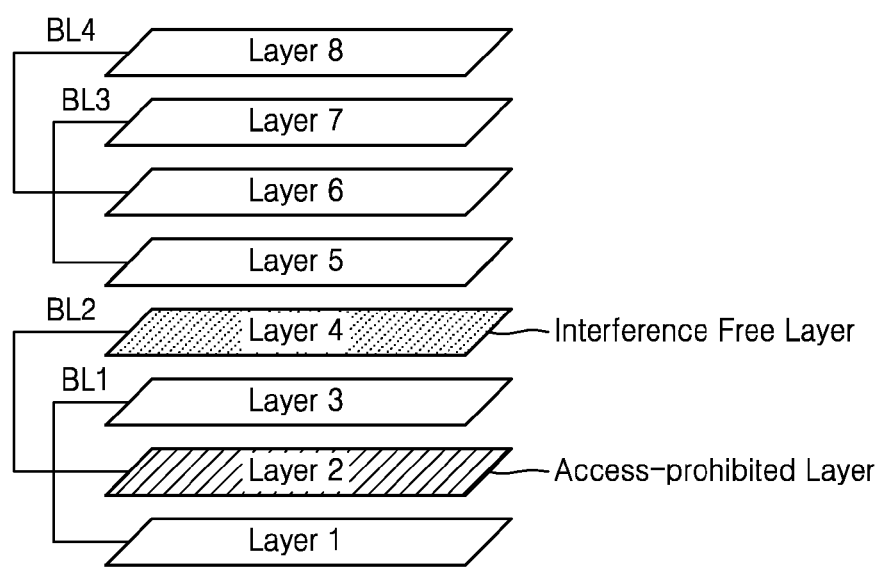

FIG. 15 is a block diagram of a memory device according to another embodiment of the inventive concept. In FIG. 15, eight layers Layer 1 through Layer 8 are shown, where two physically non-adjacent layers share one or more signal lines (e.g., a bit line). For example, Layer 1 and Layer 3 may share bit line BL1, Layer 2 and Layer 4 may share bit line BL2, Layer 5 and Layer 7 may share bit line BL3, and Layer 6 and Layer 8 may share bit line BL4. Thus, assuming that Layer 4 is designated as an interference-free layer, Layer 2 sharing bit line BL2 with Layer 4, may be designated as an access prohibited layer.

Here, only two layers (Layer 2 and Layer 4) are assumed to share a connection to one or more signal line(s). However, more than two layers may share connection(s) to signal line(s), and therefore, an interference-free layer designation may necessitate more than one access prohibited layer designation.

Figure 16:
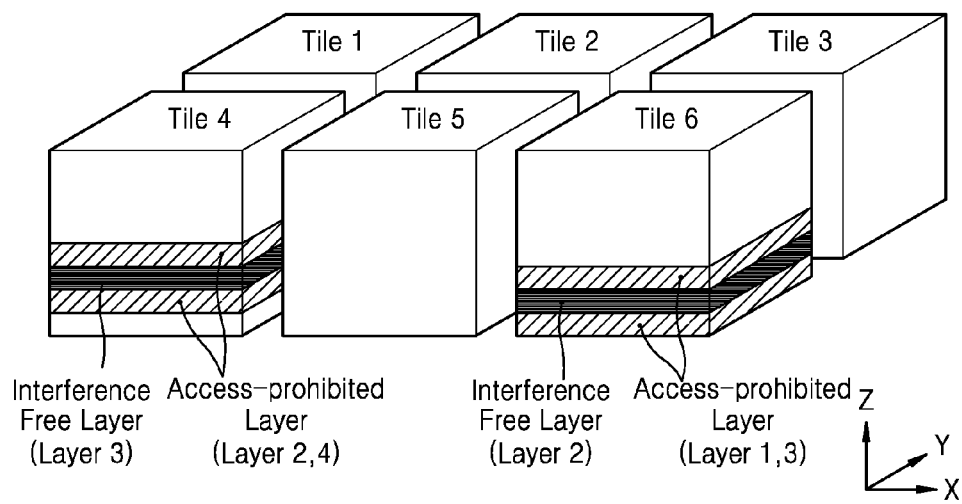
Figure 17:
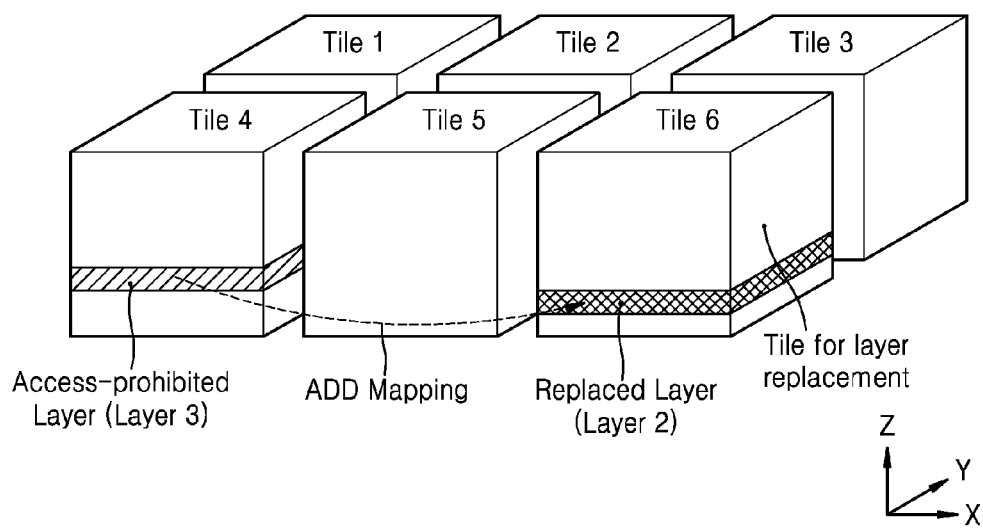

FIGS. 16 and 17 are block diagrams respectively illustrating memory devices according to various embodiments of the inventive concept. In FIGS. 16 and 17, a plurality of layers is assumed for each one of a plurality of memory tiles.

A tile may be defined variously, for example, signal lines connected to the memory cells included in one tile may share the row decoder and the column decoder. Also, as shown in FIGS. 16 and 17, one tile may include the memory cells that are arranged in a plurality of layers. For example, the plurality of layers may be divided into a plurality of cell regions, where Tile 1 through Tile 6 respectively include a plurality of layers.

As shown in FIG. 16, when setting a certain layer as the interference-free layer, the setting may be performed in a tile unit. For example, Tile 4, Layer 3 may be designated as an interference-free layer, and Tile 4, Layer 2 as well as Tile 4, Layer 4 sharing at least one signal line with Tile 4, Layer 3 may be designated as access prohibited layers. Similarly, Tile 6, Layer 2 may be designated as an interference-free layer, while Tile 6, Layer 1 and Tile 6, Layer 3 each sharing at least one signal line with Tile 6, Layer 2 may be designated as access prohibited layers.

FIG. 17 is a diagram showing an example of blocking access to the access prohibited layer according to the address conversion operation. As shown in FIG. 17, at least one of the plurality of tiles may be designated as a reserved area. For example, Tile 6, Layer 2 may be used to substitute for Tile 4, Layer 3 (an access prohibited layer).

Figure 18:
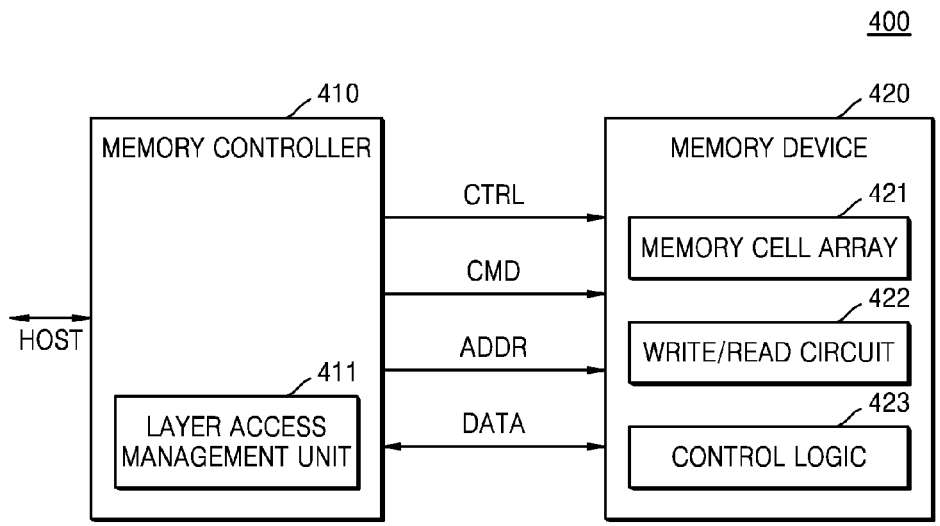
FIG. 18 is a block diagram of a memory system according to another embodiment of the inventive concept.

FIG. 18 is a block diagram illustrating a memory system 400 according to another embodiment of the inventive concept. Referring to FIG. 18, the memory device 400 may include a memory controller 410 and a resistive memory device 420. The memory device 420 may include a memory cell array 421, a write/read circuit 422, and a control logic 423. Also, the memory controller 410 may include a layer access management unit 411. Components of FIG. 18, which are the same as or similar to those of FIG. 2, operate in the same way, and thus, descriptions thereof are omitted.

According to the embodiment shown in FIG. 18, the address conversion process performed for blocking the access to the access prohibited layer may be performed by the memory controller 410. For example, the memory controller 410 may set one or more layers from among the plurality of layers included in the memory cell array 421 as the access prohibited layers, and the layer access management unit 411 may store information about the access prohibited layers. If the layer access management unit 411 receives a data access request from a host, the layer access management unit 411 compares the address accompanied with the access request (for example, a logical address) with the information stored in the layer access management unit 411 in order to determine whether the access request is about the access prohibited layer. Also, the layer access management unit 411 performs an address conversion process according to the determination result, and provides the memory device 420 with the converted address (for example, the physical address) so that a replaced layer may be accessed.

According to the above operation, the access to the access prohibited layer included in the memory cell array 421 is prevented, and occurrence of the interference in the interference-free layer sharing at least one signal line with the access prohibited layer may be prevented. Also, data that is relatively important and frequently accessed may be stored in the interference-free layer under the control of the memory controller 410.

Figure 19:
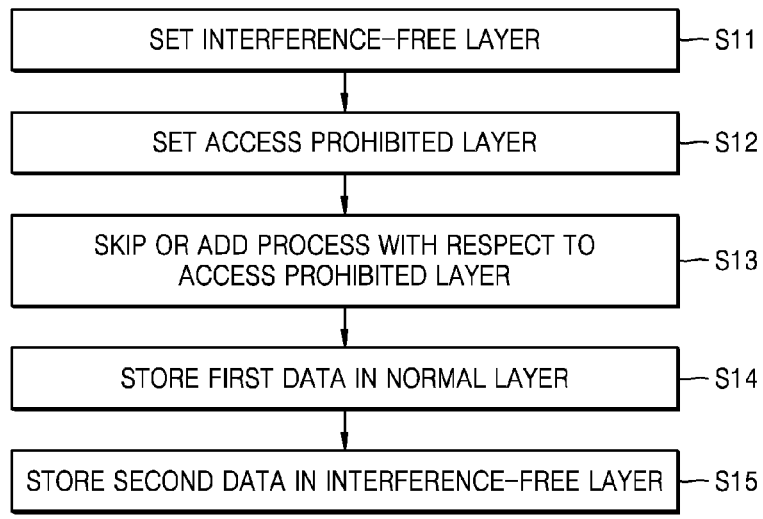
FIGS. 19, 20 and 21 are respective flowcharts summarizing methods of operating a memory device according to various embodiments of the inventive concept.
Figure 20:
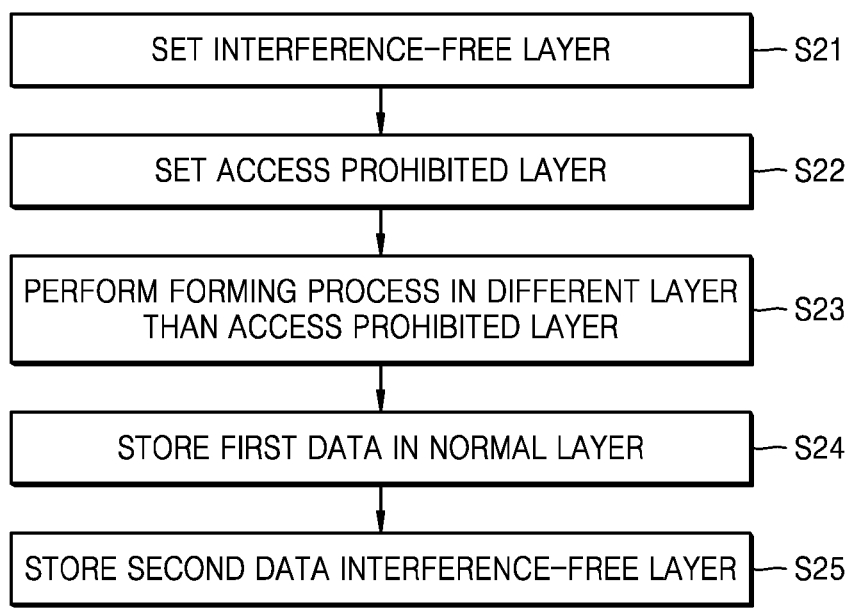
Figure 21:
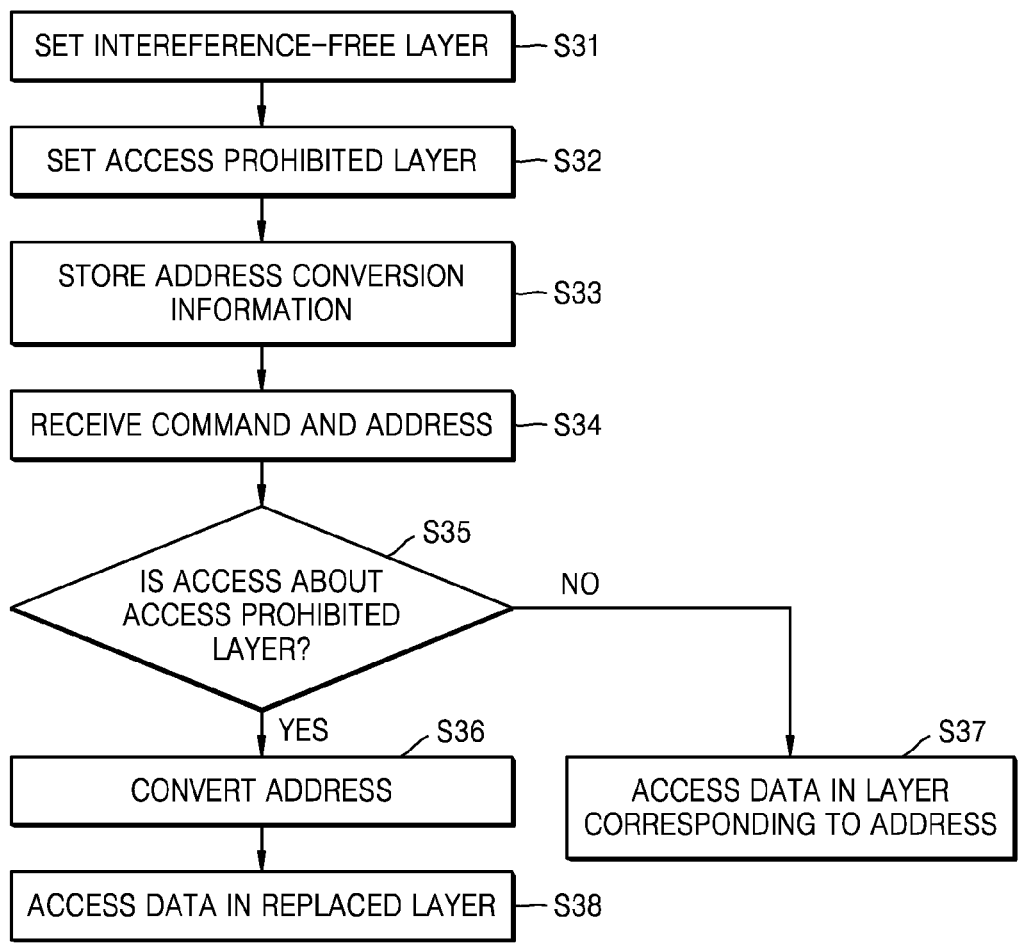

FIGS. 19, 20 and 21 are flowcharts summarizing various methods of operating a memory device according to embodiments of the inventive concept.

Referring to FIG. 19, at least one interference-free layer is set from among a plurality of layers included in the memory device (S11), and at least one layer is set as an access prohibited layer (S12). The other layers except for the access prohibited layer from among the plurality of layers may be defined as storage layers that actually store the data. That is, the storage layers are the layers for normally storing the data, and may include the interference-free layer and the normal layers.

With respect to the access prohibited layer, at least one process may be skipped or added so that the data is not accessed (S13). For example, as described in the above embodiment, at least one process from among a plurality of processes for forming memory cells in the access prohibited layer may be skipped so that the interference-free layer and the access prohibited layer may be physically separated from each other. Otherwise, an additional process such as an oxidation process may be performed so that the interference-free layer and the access prohibited layer may be physically separated from each other. In addition, an address may not be allocated to the access prohibited layer that may not normally store the data, and accordingly, the access prohibited layer may not be accessed.

When the layers are formed as described above, the data may be stored in different layers according to kinds of the data. For example, data including the ECC parity or reference information may be defined as meta data, and the meta data having higher degree of importance and frequently accessed may be distinguished from the normal data. The kind of the access requested data is determined, and according to the determination result, first data (for example, normal data) may be stored in the normal layer (S14), and second data (for example, meta data) may be stored in the interference-free layer (S15).

FIG. 20 is a diagram showing an example of electrically separating the interference-free layer and the access prohibited layer from each other. Referring to FIG. 20, the interference-free layer is set (S21), and one or more access prohibited layers are set (S22). Also, the forming process with respect to the memory cells included in the access prohibited layer is skipped as described above, and the forming process is selectively performed with the other layers except for the access prohibited layer (S23). Accordingly, the memory cells included in the access prohibited layer have very large resistance values. Then, the first data (for example, the normal data) may be stored in the normal layers (S24), and the second data (for example, the meta data) may be stored in the interference-free layer (S25).

In addition, FIG. 21 shows an example of preventing the access to the access prohibited layer through an address conversion process. Referring to FIG. 21, the interference-free layer is set (S31), and one or more access prohibited layers are set (S32). In addition, address conversion information is generated by using information about the settings of the interference-free layer and the access prohibited layer, and may be stored in the memory device (S33).

After that, a command and an address for directing a memory operation are received (S34), and it is determined whether the requested access is about the access prohibited layer by comparing the received address with the stored address conversion information (S35). According to the determination result, if the requested access is about the storage layer, not the access prohibited layer, a data access operation on the layer corresponding to the received address is performed (S36). However, if the requested access is about the access prohibited layer, the conversion operation of the received address is performed (S37), and a data access operation is performed with respect to the replaced layer by using the converted address (S38).

Figure 22:
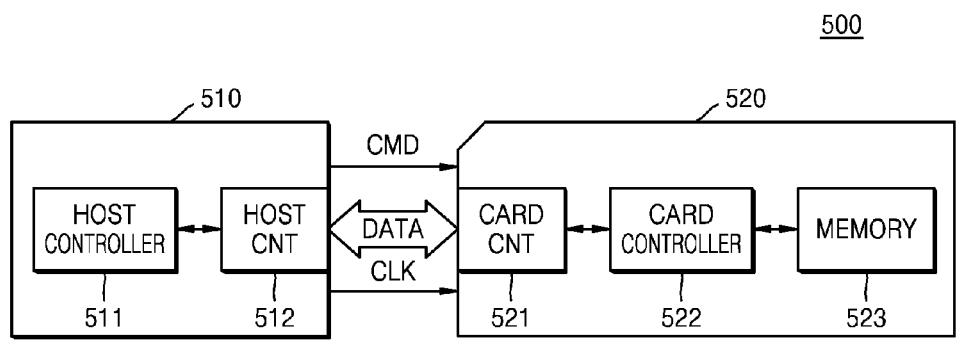
FIG. 22 is a block diagram illustrating in one example a resistive memory system according to the embodiment of the inventive concept configured as a memory card system.

FIG. 22 is a block diagram illustrating a memory card system 400 having a resistive memory system applied thereto according to an embodiment of the inventive concept.

Referring to FIG. 22, the memory card system 500 may include a host 510 and a memory card 520. The host 510 may include a host controller 511 and a host connector 512. The memory card 520 may include a card connector 521, a card controller 522, and a memory device 523. Here, the memory device 523 may be realized according to the embodiments illustrated in FIGS. 1 through 21, and accordingly, the memory device 523 may include a plurality of layers. Some of the plurality of layers may be set as interference-free layers, and some other layers may be set as access prohibited layers. Also, according to the above embodiments, at least one process may be skipped or added with respect to the access prohibited layer, or a forming process may be skipped with respect to the access prohibited layer. Otherwise, the access to the access prohibited layer may be blocked through the address conversion operation.

The host 510 may write data to the memory card 520 or may read data stored in the memory card 520. The host controller 511 may transmit a command CMD, a clock signal CLK generated by a clock generator (not shown) in the host 510, and data DATA to the memory card 520 via the host connector 512.

In response to the command CMD received via the card connector 521, the card controller 522 may store the data DATA in the memory device 523, in synchronization with a clock signal that is generated by a clock generator (not shown) in the card controller 522. The memory device 523 may store the data DATA that is transmitted from the host 510.

The memory card 520 may be embodied as a compact flash card (CFC), a microdrive, a smart media card (SMC), a multimedia card (MMC), a security digital card (SDC), a memory stick, or a USB flash memory drive.

Figure 23:
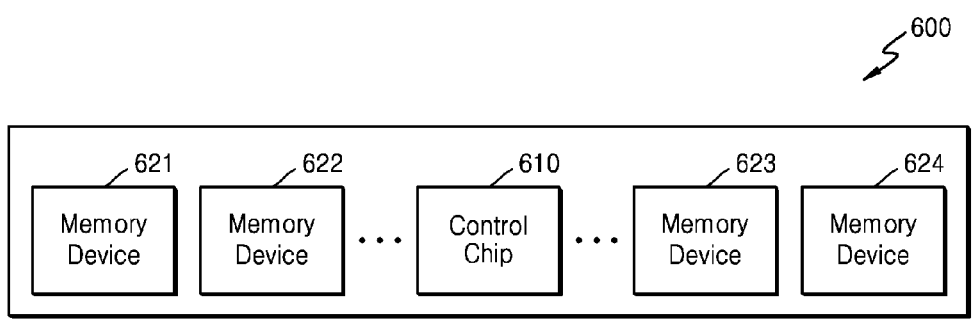
FIG. 23 is a diagram illustrating a resistive memory module according to an embodiment of the inventive concept.

FIG. 23 illustrates a resistive memory module 600, according to an embodiment of the inventive concept. Referring to FIG. 23, the resistive memory module 600 may include memory devices 621 through 624, and a control chip 610. Each of the memory devices 621 through 624 may be embodied by using the embodiments shown in FIGS. 1 through 21. In response to various signals transmitted by an external memory controller, the control chip 610 may control the memory devices 621 through 624. For example, according to various commands and addresses that are transmitted from an external source, the control chip 610 may activate the memory devices 621 through 624 corresponding to the various commands and addresses and thus may control write and read operations. Also, the control chip 610 may perform various post processing operations on read data output from each of the memory devices 621 through 624, e.g., the control chip 610 may perform error detection and correction operations on the read data.

According to the present embodiment, each of the memory devices 621 through 624 may include a plurality of layers, and some of the plurality of layers may be set as the interference-free layers and some other layers may be set as the access prohibited layers. Also, according to the above embodiment, at least one process may be skipped or added with respect to the access prohibited layer, or a forming process may be skipped with respect to the access prohibited layer. Otherwise, the access to the access prohibited layer may be blocked through the address conversion operation.

Figure 24:
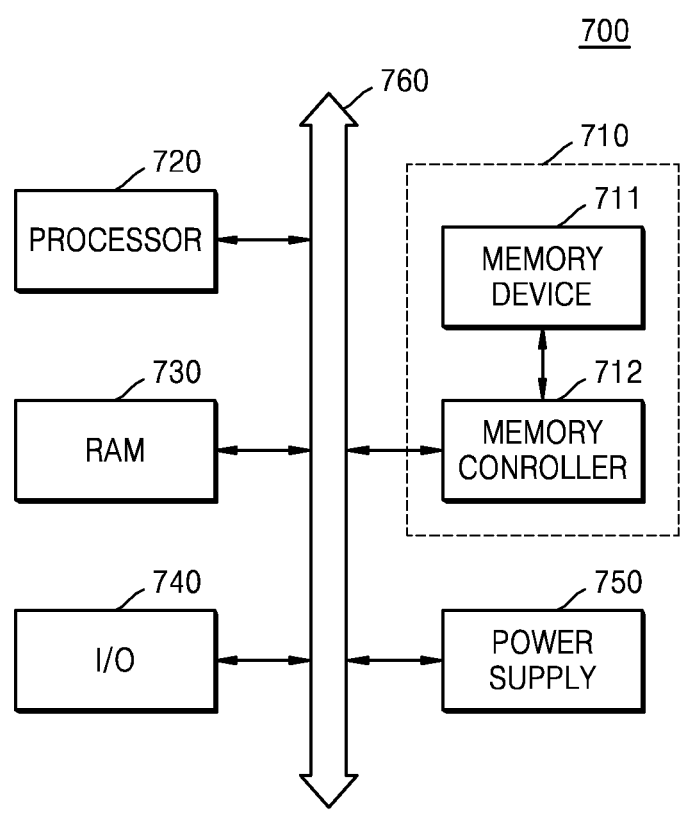
FIG. 24 is a block diagram of a computing system that may incorporate a resistive memory system according to embodiments of the inventive concept.

FIG. 24 is a block diagram illustrating a computing system 700 including a resistive memory system according to an embodiment of the inventive concept.

Referring to FIG. 24, the computing system 700 may include a memory system 710, a processor 720, a RAM 730, an input/output (I/O) device 740, and a power supply device 750. The memory system 710 may include a memory device 711 and a memory controller 722. Although not illustrated in FIG. 24, the computing system 700 may further include ports capable of communicating with a video card, a sound card, a memory card, or a USB device, or other electronic devices. The computing system 700 may be embodied as a PC, or a portable electronic device such as a notebook computer, a mobile phone, a personal digital assistant (PDA), or a camera.

The processor 720 may perform particular calculations or tasks. In one or more embodiments, the processor 720 may be a micro-processor, a Central Processing Unit (CPU), or the like. The processor 720 may perform communication with the RAM 730, the I/O device 740, and the memory system 710 via a bus 760 such as an address bus, a control bus, or a data bus. Here, the memory system 710 and/or the RAM 730 may be embodied by using the embodiments shown in FIGS. 1 through 21.

In one or more embodiments, the processor 720 may also be connected to an extended bus such as a Peripheral Component Interconnect (PCI) bus.

The RAM 730 may store data for operations of the computing system 700. As described above, the memory device according to the one or more embodiments of the inventive concept may be applied to the RAM 730. Alternatively, a DRAM, a mobile DRAM, an SRAM, a PRAM, an FRAM, or an MRAM may be used as the RAM 730.

The I/O device 740 may include an input unit such as a keyboard, a keypad, or a mouse, and an output unit such as a printer or a display. The power supply device 750 may supply an operating voltage for the operations of the computing system 700.

While the inventive concept has been particularly shown and described with reference to exemplary embodiments thereof, it will be understood that various changes in form and details may be made therein without departing from the scope of the following claims.

What is claimed is:

1. A resistive memory device comprising:
    a memory cell array comprising a plurality vertically stacked layers including one layer designated as an interference-free layer and another layer designated as an access prohibited layer, wherein
    the interference-free layer and the access prohibited layer share a connection with at least one signal line, and access operations directed to memory cells disposed in the access prohibited layer are prohibited.

2. The resistive memory device of claim 1, wherein the memory cells of the access prohibited layer are intentionally malformed during fabrication of the access prohibited layer by omitting a connectivity-necessary process.

3. The resistive memory device of claim 2, wherein each one of the memory cells in the plurality of vertically stacked layers, other than the memory cells of the access prohibited layer, includes a variable resistive device and a selection device.

4. The resistive memory device of claim 3, wherein the omission of the connectivity-necessary process results in an intentionally malformation of variable resistive devices in the memory cells of the access prohibited layer.

5. The resistive memory device of claim 3, wherein the omission of the connectivity-necessary process results in an intentionally malformation of the selection device in the memory cells of the access prohibited layer.

6. The resistive memory device of claim 1, wherein the memory cells of the access prohibited layer are separated from the memory cells of the interference-free layer by adding a connectivity-destructive process to the fabrication of the resistive memory device during or after the formation of the access prohibited layer.

7. The resistive memory device of claim 6, wherein the connectivity-destructive process is a formation of an electrically isolating layer between the access prohibited layer and the interference-free layer.

8. The resistive memory device of claim 1, wherein the memory cells of the interference-free layer store critical data, and memory cells of layers among the plurality vertically stacked layers other than the interference-free layer and the access prohibited layer are used to sort user data.

9. The resistive memory device of claim 8, wherein the critical data includes at least one of metadata, error correcting code (ECC) parity data, and reference information data.

10. The resistive memory device of claim 1, wherein the access prohibited layer is physically adjacent on one side to the interference-free layer.

11. The resistive memory device of claim 10, wherein the access prohibited layer and interference-free layer share at least one connection to a common word line.

12. The resistive memory device of claim 10, wherein the interference-free layer is an uppermost layer in the plurality vertically stacked layers.

13. The resistive memory device of claim 1, further comprising:
    control logic including a layer access management unit that converts a received address indicating a memory cell in the access prohibited layer into another address indicating a substitute memory cell in a layer of the plurality vertically stacked layers other than the access prohibited layer.

14. The resistive memory device of claim 1, wherein a lowermost layer in the plurality vertically stacked layers is a control layer including at least one of a write/read circuit, a control voltage generator and control logic that control the operation of the resistive memory device.

15. A resistive memory device comprising:
    a memory cell array comprising a plurality vertically stacked layers including a layer designated as an interference-free layer, another layer designated as a first access prohibited layer, and still another layer designated as a second access prohibited layer,
    wherein the interference-free layer respectively shares with each one of the first and second access prohibited layers a connection with at least one signal line, and access operations directed to memory cells disposed in the first and second access prohibited layers are prohibited.

16. The resistive memory device of claim 15, wherein the first access prohibited layer is physically adjacent below the first interference-free layer in the plurality of vertically stacked layers, and the second access prohibited layer is physically above the interference-free layer in the plurality of vertically stacked layers.

17. The resistive memory device of claim 15, wherein the at least one signal line is at least one of a word line and a bit line.

18. A resistive memory system comprising:
   a memory controller receiving a write request from a host, and providing a write command, a write address and write data to a resistive memory device in response to the write request;
   the resistive memory device comprising:
      control logic, and
      a memory cell array comprising a plurality vertically stacked layers including one layer designated as an interference-free layer and another layer designated as an access prohibited layer, wherein the interference-free layer and the access prohibited layer share a connection with at least one signal line and access operations directed to memory cells disposed in the access prohibited layer are prohibited.

19. The resistive memory device of claim 18, wherein the control logic comprises a layer access management unit that prohibits access operations directed to memory cells disposed in the access prohibited layer.

20. The resistive memory device of claim 19, wherein the layer access management unit comprises an address mapping control unit, upon determining that the write address indicates memory cells disposed in the access prohibition layer, converts the write address to another address indicating memory cells disposed in a layer of the plurality of vertically stacked layers other than the access prohibited layer.

* * * * *